(12) United States Patent
Cheng

(10) Patent No.: US 9,459,294 B2
(45) Date of Patent: Oct. 4, 2016

(54) POWER FLOW MANAGEMENT METHOD AND CONTROLLER USING THE SAME

(71) Applicant: NATIONAL TSING HUA UNIVERSITY, Hsinchu (TW)

(72) Inventor: Po-Tai Cheng, Hsinchu (TW)

(73) Assignee: NATIONAL TSING HUA UNIVERSITY, Hsinchu (TW)

(*) Notice: Subject to any disclaimer, the term of this patent is extended or adjusted under 35 U.S.C. 154(b) by 43 days.

(21) Appl. No.: 14/706,947

(22) Filed: May 7, 2015

(65) Prior Publication Data

US 2016/0109493 A1 Apr. 21, 2016

(30) Foreign Application Priority Data

Oct. 21, 2014 (TW) .............................. 103136325 A

(51) Int. Cl.
| | |
|---|---|
| *G01R 31/00* | (2006.01) |
| *G01R 27/08* | (2006.01) |
| *G01R 21/00* | (2006.01) |
| *G01R 25/04* | (2006.01) |

(52) U.S. Cl.
CPC ............... *G01R 21/00* (2013.01); *G01R 25/04* (2013.01)

(58) Field of Classification Search
CPC ............................... G01R 21/00; G01R 25/04
USPC ........................................ 324/76.12, 96, 713
See application file for complete search history.

(56) References Cited

U.S. PATENT DOCUMENTS

2006/0170410 A1* 8/2006 Bjorn .................. G01R 15/246
324/96

FOREIGN PATENT DOCUMENTS

| TW | 1302238 B | 10/2008 |
|----|-----------|---------|
| TW | 1377775 B | 11/2012 |
| TW | 1445296 B | 7/2014 |
| TW | 1445427 B | 7/2014 |

* cited by examiner

*Primary Examiner* — Jermele M Hollington
*Assistant Examiner* — Farhana Hoque
(74) *Attorney, Agent, or Firm* — CKC & Partners Co., Ltd.

(57) ABSTRACT

A power flow management method and a controller are provided. First, sensing voltage signals and sensing current signals between a power supplying module and a multilevel converter module are obtained. Positive sequence voltage signals, positive sequence current, negative voltage signals and negative current signals are generated according to the sensing voltage signals and the sensing current signals. Forward powers are calculated according to the positive sequence voltage signals, positive sequence current, negative voltage signals and negative current signals. DC voltage signals are obtained from the multilevel converter module, and feedback powers are calculated accordingly. A magnitude and a phase of a zero sequence voltage injection signal are determined according to the forward powers and the feedback powers. Accordingly, the generated zero sequence voltage injection signal is used to manage power flow effectively.

18 Claims, 19 Drawing Sheets

POWER FLOW MANAGEMENT METHOD AND CONTROLLER USING THE SAME

RELATED APPLICATIONS

This application claims priority to Taiwan Application Serial Number 103136325 filed Oct. 21, 2014, which is herein incorporated by reference.

BACKGROUND

1. Field of Invention

The present invention relates to a power flow management method. More particularly, the present invention relates to a power flow management method and a controller using a zero-sequence voltage.

2. Description of Related Art

A power system is vulnerable under natural disasters such as a lighting struck and a salt damage, or other accidents such as being bumped by an object (e.g. car accidents) and dropping of wires. These situations may break transmission and distribution equipments or lines. Momentary power failures caused by the malfunctions or voltage sags caused when a fault current flows into adjacent lines can not completely be avoid for a power system. Except for the voltage sag, some common problems which will cause poor power quality such as interruption, fluctuation, flicker, swell, and harmonics can be alleviated by a static synchronous compensator (STATCOM).

The STATCOM can monitor voltages and timely inject reactive power for compensation. For example, when detecting a grid voltage is lower than a predetermined value, the STATCOM operates as a capacitor and injects reactive power into a grid to raise the grid voltage. Minimizing the affect of the reactive power to make sure the maximum power transmission efficiency is a key of a stable grid. The reactive power not only makes a local voltage lower than a rated voltage, but also increases loads of a transmission line and a transformer, and this a transmission ability of active power is limited. Therefore, by decreasing the current of the reactive power on a transmission line, a transmission capacity can be increased and simultaneously a power loss is reduced. The STATCOM is required to comply with a strict requirement of dynamic reactive power compensation and a grid code to stabilize the voltages. From an aspect of using the electricity, a momentary power failure (about one minute) or a voltage sage (about two seconds) does not have a significant impact on regular electricity using, but they may cause a lot of damages to industrial users. From an aspect of providing the electricity, keeping frequency and voltages of electricity in a safe range would be an important indicator for the operation quality of the power system.

SUMMARY

Embodiments of the present invention provide a power flow managing method and a controller in which a zero-sequence voltage is used to control the power flow so as to balance DC voltages.

An embodiment of the present invention provides a power flow managing method for a controller disposed in a power system. The power system includes a power providing module and a multilevel converter module. The power flow managing method includes: obtaining sensed voltage signals and sensed current signals between the power providing module and the multilevel converter module; generating positive-sequence voltage signals, positive-sequence current signals, negative-sequence voltage signals and negative-sequence current signals according to the sensed voltage signals and the sensed current signals; calculating feedforward power according to the positive-sequence voltage signals, the positive-sequence current signals, the negative-sequence voltage signals and the negative-sequence current signals; obtaining DC (direct-current) voltage signals from the multilevel converter module, and calculating averaged values and an overall averaged value according to the DC voltage signals; calculating feedback power according to the averaged values and the overall averaged value; determining real power of a zero-sequence voltage injection signal according to the feed forward power and the feedback power, and determining an magnitude and a phase of the zero-sequence voltage injection signal according to the real power of the zero-sequence voltage injection signal, the positive-sequence current signals and the negative-sequence current signals.

In one embodiment, the DC voltage signals includes first DC voltage signals at a first phase, second DC voltage signals at a second phase, and third DC voltage signals at a third phase. The step of calculating the averaged values and the overall averaged value includes: performing a moving average filter and an average operation on the first DC voltage signals to obtain a first averaged value of the averaged values; performing the moving average filter and the average operation on the second DC voltage signals to obtain a second averaged value of the averaged values; performing the moving average filter and the average operation on the third DC voltage signals to obtain a third averaged value of the averaged values; and calculating an average of the first averaged value, the second averaged value and the third averaged value as the overall averaged value.

In one embodiment, the step of generating the feedback power according to the averaged values and the overall averaged value includes: subtracting the first averaged value from the overall averaged value to generate a first difference value, and generating first feedback power of the feedback power according to the first difference value by a first proportional controller; subtracting the second averaged value from the overall averaged value to generate a second difference value, and generating second feedback power of the feedback power according to the second difference value by a second proportional controller; and subtracting the third averaged value from the overall averaged value to generate a third difference value, and generating third feedback power of the feedback power according to the third difference value by a third proportional controller.

In one embodiment, the feedforward power includes first feedforward power, second feedforward power, and third feedforward power. The step of determining of the real power of the zero-sequence voltage injection signal according to the feedforward power and the feedback power includes: subtracting the first feedforward power from the first feedback power to generate a first power command; subtracting the second feedforward power from the second feedback power to generate a second power command; subtracting the third feedforward power from the third feedback power to generate a third power command; and performing an alpha-beta transform on the first power command, the second power command and the third power command to obtain the real power of the zero-sequence voltage injection signal.

In one embodiment, the method further includes: generating balanced voltage signals according to the DC voltage signals and the averaged values; generating positive-sequence current commands and negative-sequence current commands according to a real power command, a reactive power command, and the overall averaged value; generating reference voltage signals according to the positive-sequence current commands, the negative-sequence current commands, the positive-sequence voltage signals, the positive-sequence current signals, the negative-sequence voltage signals and the negative-sequence current signals; and generating modulating reference signals according to the reference voltage signals, the zero-sequence voltage injection signal, and the balanced voltage signals, in which the modulating reference signals are configured to generate a modulated signal.

In one embodiment, the method further includes: obtaining bridge cell information of the multilevel converter module, in which the bridge cell information indicate whether each of bridge cell in the multilevel converter module is damaged; and limiting an magnitude and a phase of the zero-sequence voltage injection signal according to the bridge cell information.

In one embodiment, the step of limiting the magnitude and the phase of the zero-sequence voltage injection signal according to the bridge cell information includes: calculating converter outputting voltages; selecting one of the converter outputting voltages according to the bridge cell information; and determining an upper limit and a lower limit of the magnitude of the zero-sequence voltage injection signal according to the overall averaged value and the one of the converter outputting voltages.

In one embodiment, the method further includes: if a voltage sag occurs, controlling the negative-sequence current commands to decrease magnitudes of the negative-sequence voltage signals, and controlling magnitudes of the negative-sequence current commands by using a peak upper limit of an overall current.

One embodiment of the present invention provides a controller disposed in a power system. The power system includes a power providing module and a multilevel converter module. The controller includes a component extracting circuit, an average value calculating circuit and a zero-sequence voltage generating circuit. The component extracting circuit is configured to obtain sensed voltage signals and sensed current signals between the power providing module and the multilevel converter module, and to generate positive-sequence voltage signals, positive-sequence current signals, negative-sequence voltage signals and negative-sequence current signals according to the sensed voltage signals and the sensed current signals. The average value calculating circuit is configured to obtain DC voltage signals from the multilevel converter module, and to calculate averaged values and an overall averaged value according to the DC voltage signals. The zero-sequence voltage generating circuit is coupled to the component extracting circuit and the average value calculating circuit, and is configured to calculate feedforward power according to the positive-sequence voltage signals, the positive-sequence current signals, the negative-sequence voltage signals and the negative-sequence current signals, and to calculate feedback power according to the averaged values and the overall averaged value, and to determine real power of a zero-sequence voltage injection signal according to the feedforward power and the feedback power. The zero-sequence voltage generating circuit also determines a magnitude and a phase of the zero-sequence voltage injection signal according to the real power of the zero-sequence voltage injection signal, the positive-sequence current signals and the negative-sequence current signals.

In one embodiment, the DC voltage signals includes first DC voltage signals at a first phase, second DC voltage signals at a second phase, and third DC voltage signals at a third phase. The average value calculating circuit is further configured to perform a moving average filter and an average operation on the first DC voltage signals to obtain a first averaged value of the averaged values. The average value calculating circuit performs the moving average filter and the average operation on the second DC voltage signals to obtain a second averaged value of the averaged values, performs the moving average filter and the average operation on the third DC voltage signals to obtain a third averaged value of the averaged values, and calculates an average of the first averaged value, the second averaged value and the third averaged value as the overall averaged value.

In one embodiment, the zero-sequence voltage generating circuit includes a feedforward power calculating circuit and a feedback power calculating circuit. The feedforward power calculating circuit is configured to calculate the feedforward power. The feedback power calculating circuit subtracts the first averaged value from the overall averaged value to generate a first difference value, and generates first feedback power of the feedback power according to the first difference value by a first proportional controller. The feedback power calculating circuit subtracts the second averaged value from the overall averaged value to generate a second difference value, and generates second feedback power of the feedback power according to the second difference value by a second proportional controller. The feedback power calculating circuit subtracts the third averaged value from the overall averaged value to generate a third difference value, and generates third feedback power of the feedback power according to the third difference value by a third proportional controller.

In one embodiment, the zero-sequence voltage generating circuit further includes a zero-sequence voltage calculating circuit coupled to the feedback power calculating circuit and the feedforward power calculating circuit. The feedforward power includes first feedforward power, second feedforward power and third feedforward power. The zero-sequence voltage calculating circuit subtracts the first feedforward power from the first feedback power to generate a first power command, subtracts the second feedforward power from the second feedback power to generate a second power command, subtracts the third feedforward power from the third feedback power to generate a third power command; and performs an alpha-beta transform on the first power command, the second power command and the third power command to obtain the real power of the zero-sequence voltage injection signal.

In one embodiment, the controller further includes an individual balancing controlling circuit, a current command generating circuit, a current regulating circuit, and a calculating circuit. The individual balancing controlling circuit is coupled to the average value calculating circuit, and is configured to generate balanced voltage signals according to the DC voltage signals and the averaged values. The current command generating circuit is coupled to the average value calculating circuit, and is configured to generate positive-sequence current commands and negative-sequence current commands according to a real power command, a reactive power command, and the overall averaged value. The current regulating circuit is coupled to the component extracting circuit and the current command generating circuit, and is configured to generate reference voltage signals according to the positive-sequence current commands, the negative-sequence current commands, the positive-sequence voltage signals, the positive-sequence current signals, the negative-sequence voltage signals and the negative-sequence current signals. The calculating circuit is coupled to the current regulating circuit, the zero-sequence voltage generating circuit and the individual balancing controlling circuit, and is configured to generate modulating reference signals according to the reference voltage signals, the zero-sequence voltage injection signal, and the balanced voltage signals. The modulating reference signals are configured to generate a modulated signal.

In one embodiment, the zero-sequence voltage generating circuit is further configured to obtain bridge cell information of the multilevel converter module. The bridge cell information indicates whether each of bridge cell in the multilevel converter module is damaged. The zero-sequence voltage generating circuit limits a magnitude and a phase of the zero-sequence voltage injection signal according to the bridge cell information.

In one embodiment, the zero-sequence voltage generating circuit is further configured to calculate converter outputting voltages, select one of the converter outputting voltages according to the bridge cell information, and determine an upper limit and a lower limit of the magnitude of the zero-sequence voltage injection signal according to the overall averaged value and the one of the converter outputting voltages.

In one embodiment, if a voltage sag occurs, the current command generating circuit controls the negative-sequence current commands to decrease magnitudes of the negative-sequence voltage signals, and controls magnitudes of the negative-sequence current commands by using a peak upper limit of an overall current.

In one embodiment, the current command generating circuit is further configured to determine the magnitudes of the negative-sequence current commands according to phases of the negative-sequence voltage signals, phases of the positive-sequence current signals and the peak upper limit.

As disclosed above, in the power flow managing method and the controller provided by the embodiments of the present invention, freedom of the zero-sequence voltage is used, and therefore the voltage balance and the reactive power compensation are better. In addition, it has advantages of the fault tolerance and the peak limitation in some embodiments.

BRIEF DESCRIPTION OF THE DRAWINGS

The invention can be more fully understood by reading the following detailed description of the embodiment, with reference made to the accompanying drawings as follows.

DETAILED DESCRIPTION

Specific embodiments of the present invention are further described in detail below with reference to the accompanying drawings, however, the embodiments described are not intended to limit the present invention and it is not intended for the description of operation to limit the order of implementation. Moreover, any device with equivalent functions that is produced from a structure formed by a recombination of elements shall fall within the scope of the present invention. Additionally, the drawings are only illustrative and are not drawn to actual size.

First Embodiment

Figure 1:
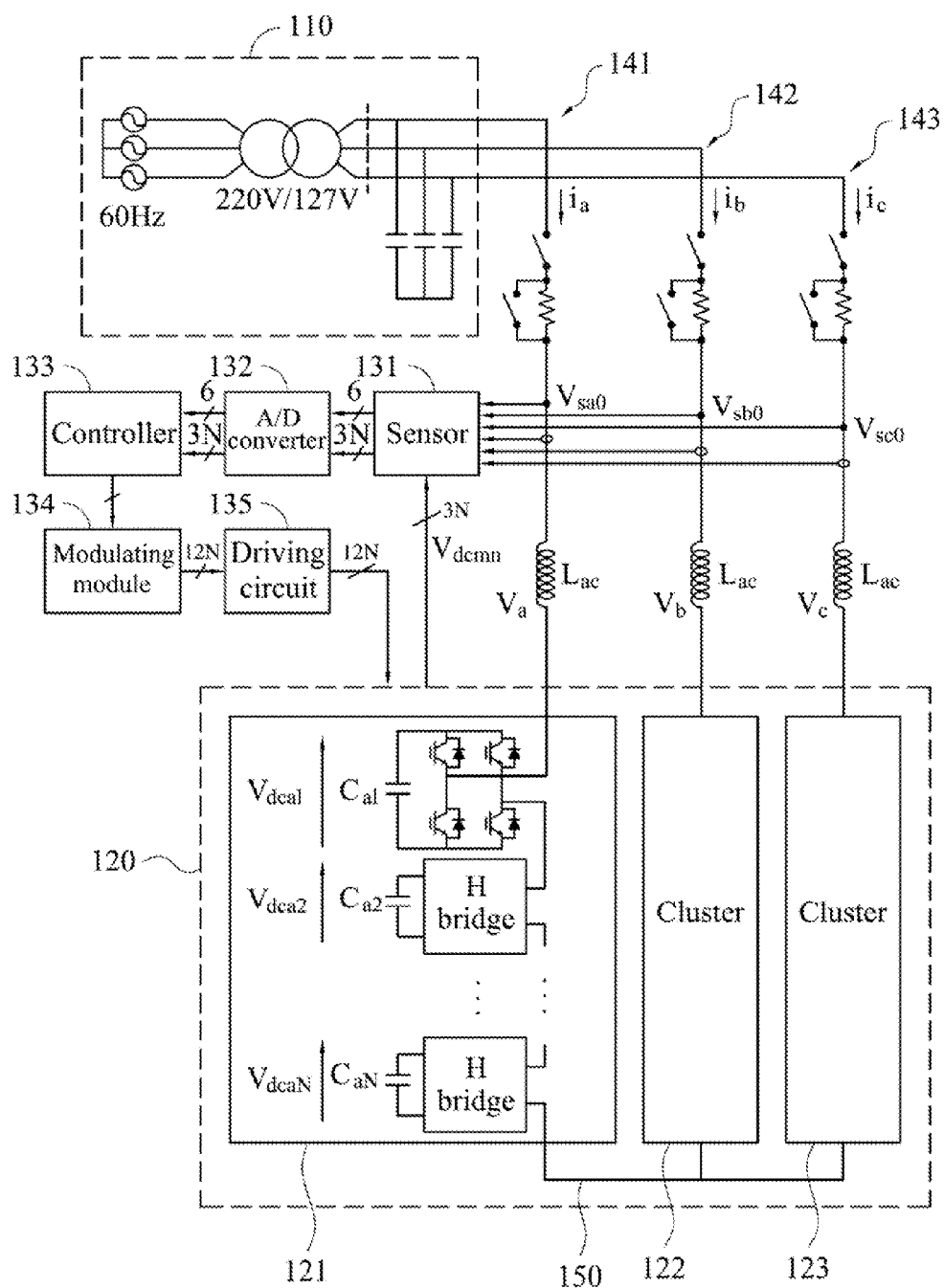
FIG. 1 is a configuration diagram of a power system according to a first embodiment.

FIG. 1 is a configuration diagram of a power system according to a first embodiment. Referring to FIG. 1, a power system 100 includes a power providing module 110, a multilevel converter module 120, a sensor 131, an analog to digital converter (A/D) 132, a controller 133, a modulating module 134, and a driving circuit 135. A cascaded H-bridge pulse-width modulation (PWM) converter, which is also called Modular Multilevel Cascaded Converter with Single-Star Bridge Cells (MMCC-SSBC), is implemented in FIG. 1.

The power providing module 110 has a first phase 141, a second phase 142 and a third phase 143. Herein, "a", "b", and "c" are used to present three different phases. For example, a current $i_a$ represents the current on the phase 141, a current $i_b$ represents the current on the phase 142; and a current $i_c$ represents the current on the phase 143. In the embodiment, the power providing module 110 is a distributed generation module, but the invention is not limited thereto. For example, the power providing module 110 may also be a transmission line.

The multilevel converter module 120 includes clusters 121-123 belong to different phases. Each cluster includes cascaded bridge cells, and each bridge cell includes a capacitor and a H bridge. For example, the cluster 121 includes capacitors $C_{a1}, C_{a2} \ldots, C_{aN}$, and each capacitor is coupled to a H bridge, where N is a positive integer. The capacitor $C_{a1}$ has a voltage $v_{dca1}$ the capacitor $C_{a2}$ has a voltage $v_{dca2}$, and the capacitor $C_{aN}$ has a voltage $v_{dcaN}$, and so on.

The sensor 131 senses the voltage on each capacitor in the multilevel converter module 120. That is, the sensor 131 obtains 3N DC voltage signals denoted as $v_{dcmn}$, where "m" could be "a", "b", or "c", and "n" is a positive integer from 1 to N. In addition, the sensor 131 further senses voltages $v_{saO}, v_{sbO}, v_{scO}$, (also referred to sensed voltage signals) and the current $i_a, i_b, i_c$ (also referred to sensed current signals) between the power providing module 110 and the multilevel converter module 120.

The sensor 131 transmits the sensed signals to the analog to digital converter 132, and the analog to digital converter 132 converts these analog signals into digital signals and transmits the digital signals to the controller 133. The controller 133 generates a control signal according to the digital signals for the modulating module 134. The modulating module 134 performs a modulation algorithm on the control signal to generate modulated signals for the driving circuit 135. In the embodiment, the modulating module 134 used a phase shifted PWM, but the invention is not limited thereto. The driving circuit 135 controls switches (total of 12N) of the H bridges in the clusters 121-123 according to the modulated signals.

Figure 2:
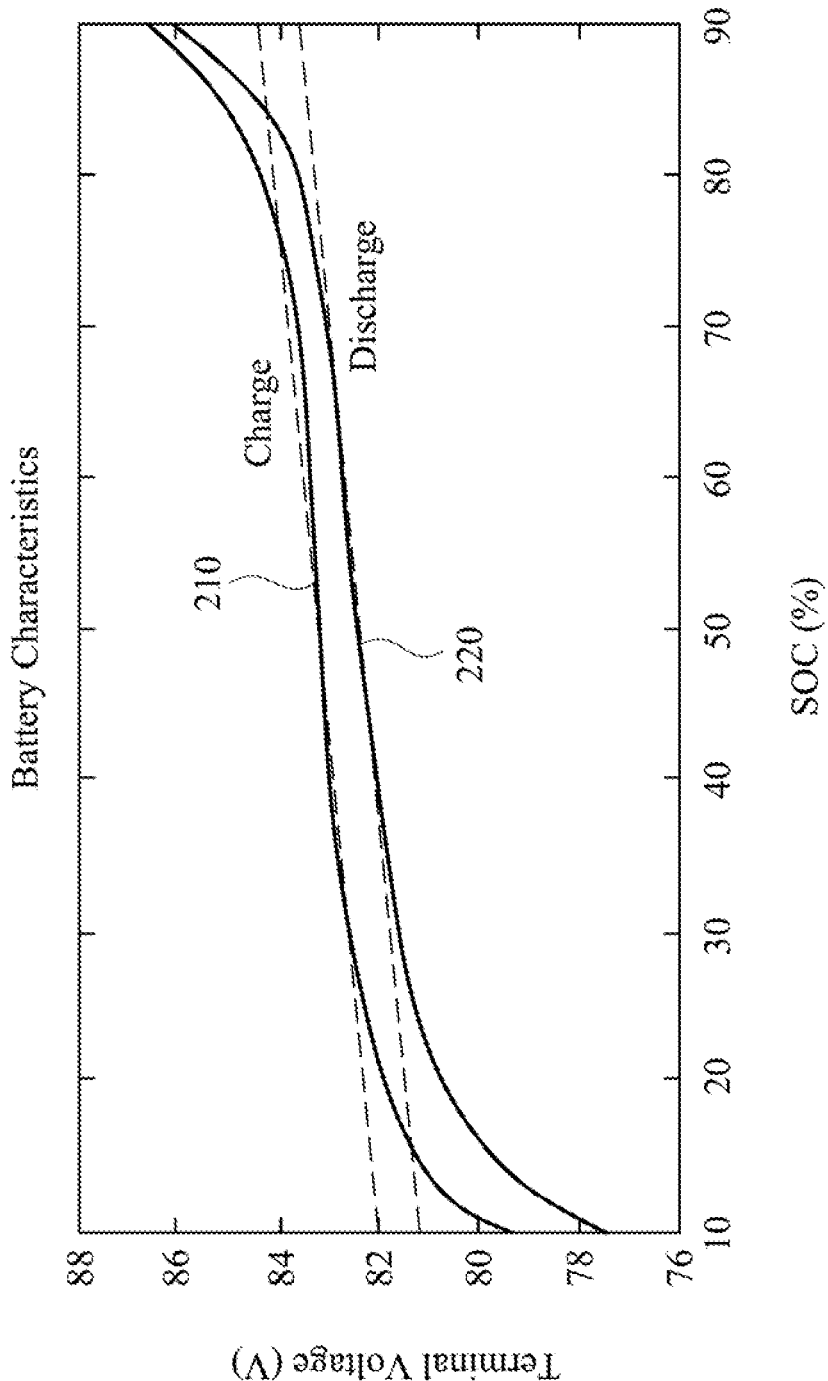
FIG. 2 is curve diagram illustrating a charging state according to the first embodiment.

In the embodiment, the multilevel converter module 120 charges and discharges along with the power flow, so as to compensate or absorb the power provided by the power providing module 110. Alternatively, the multilevel converter module 120 may also provide reactive power to stabilize the power system 100. However, a state-of-charge (SOC) of the multilevel converter module 120 should be as balancing as possible to prevent the multilevel converter module 120 from being damaged due to over-charging or over-discharging. FIG. 2 is a curve diagram illustrating a charging state according to the first embodiment. Referring to FIG. 2, the horizontal axis is the SOC, and the vertical axis is a terminal voltage of a battery (capacitor). The SOC is a percentage representing an available capacitor in proportion to the maximum capacitor. In one embodiment, the capacitors in the multilevel converter module 120 charges along with the curve 210, and discharge along with the curve 220. If the batter is not in an over-charging state or an over-discharging state, the curve 210 and 220 are substantially linear. The over-charging state and the over-discharging may damage the battery, and therefore the controller 133 considers the SOC of the battery when controlling the power flow to prevent the batter from being damaged.

Figure 3:
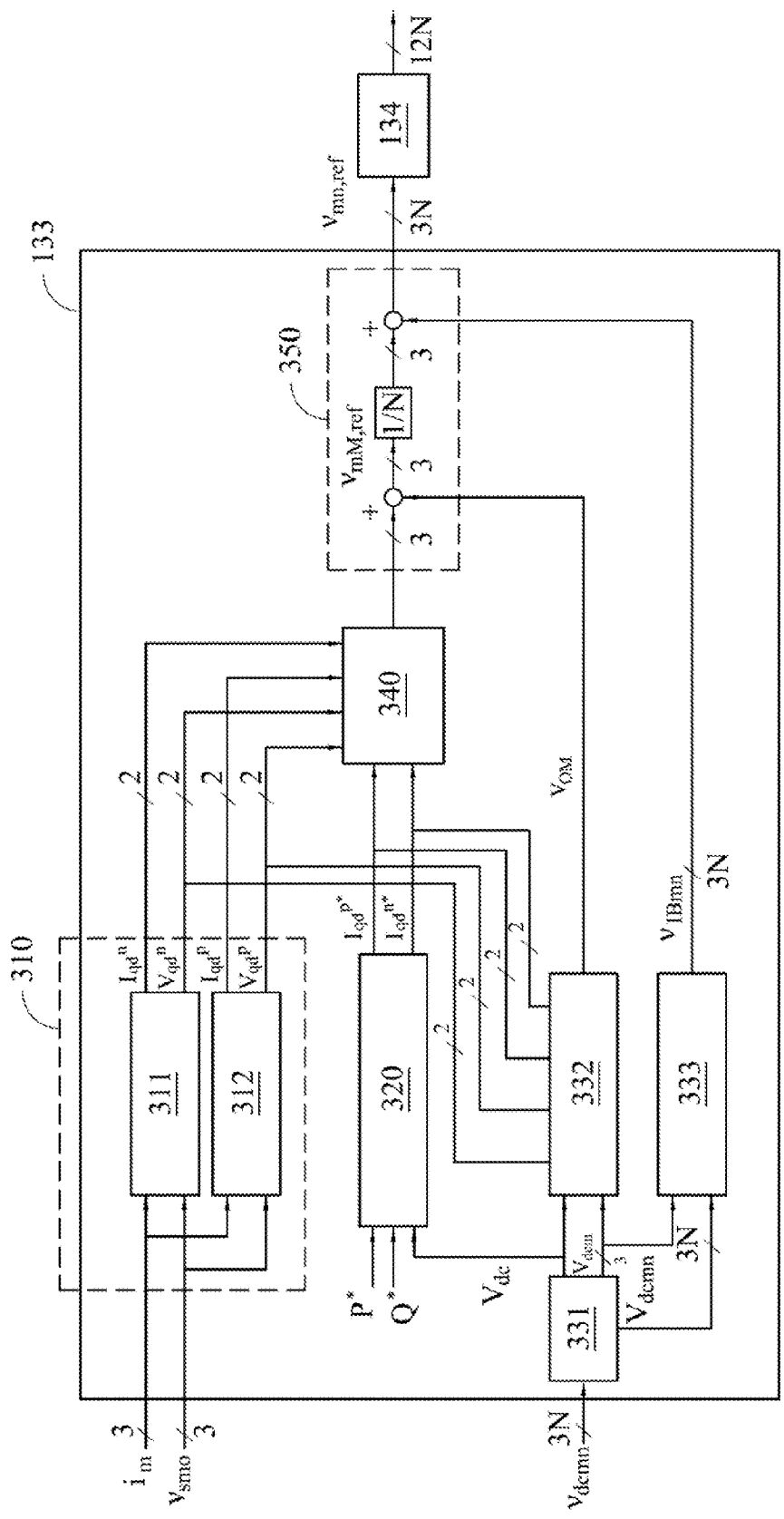
FIG. 3 is a block diagram illustrating the controller 133 according to the first embodiment.

FIG. 3 is a block diagram illustrating the controller 133 according to the first embodiment. Referring to FIG. 3, the controller 133 includes a component extracting circuit 310, a current command generating circuit 320, an average value calculating circuit 331, a zero-sequence voltage generating circuit 332, an individual balancing controlling circuit 333, a current regulating circuit 340 and a calculating circuit 350. Notice that each circuit in the controller 133 can also be implemented as program instructions, and the controller 133 can be implemented as a processor to execute the program instructions. The invention does not limit whether the functions of the controller 133 are implemented as hardware or software.

The component extracting circuit 310 receives the sensed voltage signal $v_{smO}$ and the sensed current signal $i_m$, and accordingly generates positive-sequence voltage signals $V_{qd}^p$, positive-sequence current signals $I_{qd}^p$, negative-sequence voltage signals $V_{qd}^n$ and negative-sequence current signals $I_{qd}^n$. For example, the component extracting circuit 310 includes a negative-sequence component extracting circuit 311 and a positive-sequence component extracting circuit 312. The component extracting circuit 310 can execute a symmetric component algorithm to obtain the said signals. For example, because of the MMCC-SSBC's star configuration and its floating neutral point 150, there is no zero-sequence current in the converter. Also, the converter does not detect any zero-sequence voltage. Therefore, the component extracting circuit 310 can obtain the positive-sequence voltage signals $V_{qd}^p$, the positive-sequence current signals $I_{qd}^p$, the negative-sequence voltage signals $V_{qd}^n$ and the negative-sequence current signals $I_{qd}^n$ according to the following equation (1). The number of the positive-sequence voltage signals $V_{qd}^p$, which are $V_q^p$ and $V_d^p$, is two. The number of the positive-sequence current signals $I_{qd}^p$, which are $I_q^p$ and $I_d^p$, is two. The number of the negative-sequence voltage signals $V_{qd}^n$, which are $V_q^n$ and $V_d^n$, is two. The number of the negative-sequence current signals $I_{qd}^n$, which are $I_q^n$ and $I_d^n$, is two.

$$\begin{bmatrix} v_{suO} \\ v_{sbO} \\ v_{wO} \end{bmatrix} = \begin{bmatrix} 1 & 0 \\ -1/2 & -\sqrt{3}/2 \\ -1/2 & \sqrt{3}/2 \end{bmatrix} \begin{bmatrix} v_\alpha \\ v_\beta \end{bmatrix} = \begin{bmatrix} 1 & 0 \\ -1/2 & -\sqrt{3}/2 \\ -1/2 & \sqrt{3}/2 \end{bmatrix} \quad (1)$$

$$\left( \begin{bmatrix} \cos\omega t & \sin\omega t \\ -\sin\omega t & \cos\omega t \end{bmatrix} \begin{bmatrix} V_q^p \\ V_d^p \end{bmatrix} + \begin{bmatrix} \cos\omega t & -\sin\omega t \\ \sin\omega t & \cos\omega t \end{bmatrix} \begin{bmatrix} V_q^n \\ V_d^n \end{bmatrix} \right)$$

$$\begin{bmatrix} i_a \\ i_b \\ i_c \end{bmatrix} = \begin{bmatrix} 1 & 0 \\ -1/2 & -\sqrt{3}/2 \\ -1/2 & \sqrt{3}/2 \end{bmatrix} \begin{bmatrix} i_\alpha \\ i_\beta \end{bmatrix} = \begin{bmatrix} 1 & 0 \\ -1/2 & -\sqrt{3}/2 \\ -1/2 & \sqrt{3}/2 \end{bmatrix}$$

$$\left( \begin{bmatrix} \cos\omega t & \sin\omega t \\ -\sin\omega t & \cos\omega t \end{bmatrix} \begin{bmatrix} I_q^p \\ I_d^p \end{bmatrix} + \begin{bmatrix} \cos\omega t & -\sin\omega t \\ \sin\omega t & \cos\omega t \end{bmatrix} \begin{bmatrix} I_q^n \\ I_d^n \end{bmatrix} \right)$$

Figure 4:
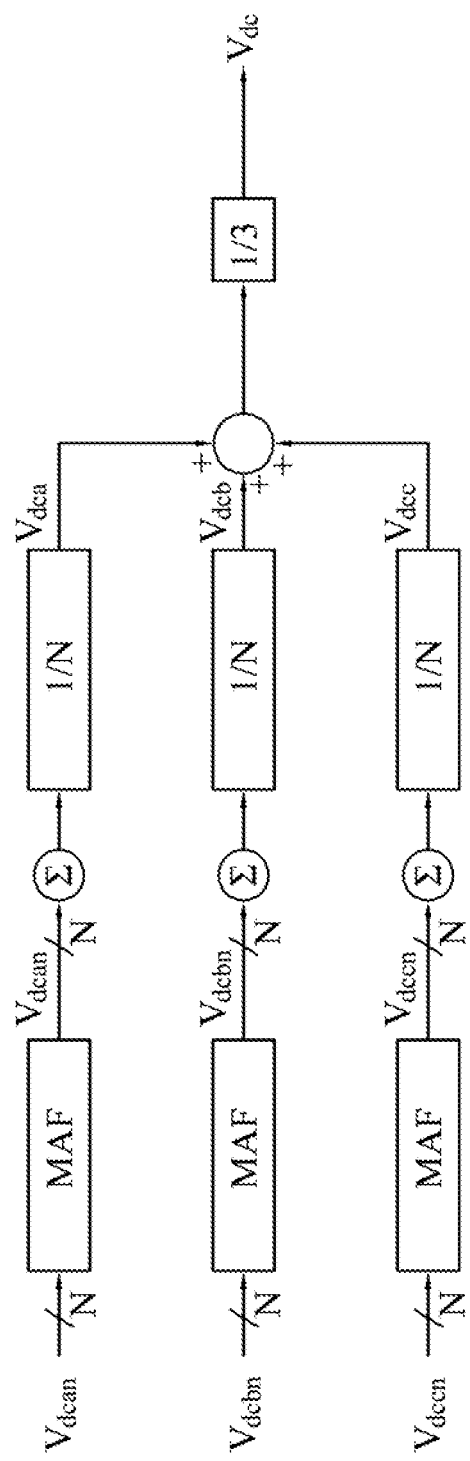
FIG. 4 is a schematic diagram illustrating the average value calculating circuit according to the first embodiment.

FIG. 4 is a schematic diagram illustrating the average value calculating circuit according to the first embodiment. Referring to FIG. 4, the average value calculating circuit 331 generates averaged values and an overall averaged value according to the DC voltage signals $v_{dcmn}$. In detail, the DC voltage signals $v_{dcmn}$ includes first DC voltage signals $v_{dcan}$ on the first phase, second DC voltage signals $v_{dcbn}$ on the second phase, and third DC voltage signals $v_{dccn}$ on the third phase. The average value calculating circuit 331 performs a moving average filter (MAF) and an average operation on the first DC voltage signals $v_{dcan}$ to obtain a first averaged value $V_{dca}$, but the invention does not limit the filter used in the MAF. The average value calculating circuit 331 also performs the moving average filter and the average operation on the second DC voltage signals $V_{dcbn}$ to obtain a second averaged value $V_{dcb}$ and performs the moving average filter and the average operation on the third DC voltage signals $V_{dccn}$ to obtain a third averaged values $V_{dcc}$. At last, the average value calculating circuit 331 calculates the average of the first averaged value $V_{dca}$, the second averaged value $V_{dcb}$ and the third averaged value $V_{dcc}$ as the overall averaged value $V_{dc}$. In other embodiments, the average value calculating circuit 331 may perform any other filer (e.g. a low pass filter) instead of the MAF and the average operation on the DC voltage signals $v_{dcan}, v_{dcbn}$ and $v_{dccn}$ respectively to obtain the averaged value $v_{dca}, v_{dcb}$, and $v_{dcc}$.

Figure 5:
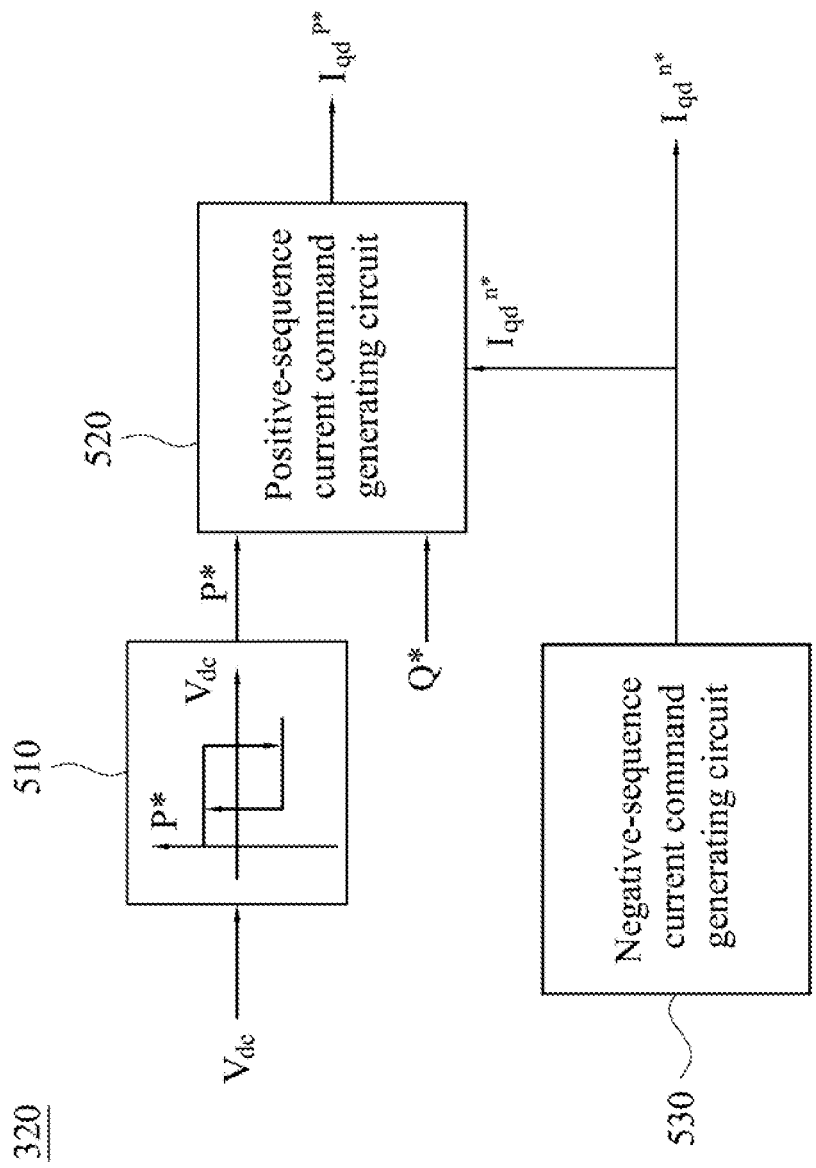
FIG. 5 is a schematic diagram illustrating the current command generating circuit according to the first embodiment.

FIG. 5 is a schematic diagram illustrating the current command generating circuit according to the first embodiment. Referring to FIG. 5, the current command generating circuit 320 includes a real power command generating circuit 510, a positive-sequence current command generating circuit 520 and a negative-sequence current command generating circuit 530. The real power command generating circuit 510 and the positive-sequence current command generating circuit 520 are configured to generate positive-sequence current commands $I_{qd}^{p*}$ according to the overall averaged value $V_{dc}$, the real power command P*, and the reactive power command Q*. The negative-sequence current command generating circuit 530 is configured to generate the negative-sequence current commands $I_{qd}^{n*}$. However, the invention does not limit the approach that the real power command generating circuit 510, the positive-sequence current command generating circuit 520 and the negative-sequence current command generating circuit 530 adopt. For example, the current command generating circuit 320 may adopt a peak current limit control (PCLC), or any other controlling approach. In one embodiment, the current command generating circuit 320 can determine the approach adopted according to the user's demands.

Referring to FIG. 1 and FIG. 3, the star configuration and the floating neutral point 150 provide the control flexibility to shift the potential of the neutral point 150 without affecting the converter's output line-to-line voltages and phase currents. In the embodiment, the controller 133 generates a zero-sequence voltage injection signal to change the potential of the neutral point 150. In detail, the zero-sequence voltage generating circuit 332 calculates feedforward power of the power providing module 110 according to the positive-sequence voltage signals $V_{qd}^{p}$, the positive-sequence current signals $I_{qd}^{p}$, the negative-sequence voltage signals $V_{qd}^{n}$, and the negative-sequence current signals $I_{qd}^{n}$. The zero-sequence voltage generating circuit 332 also calculates feedback power of the multilevel converter module 120 according to the averaged values $V_{dcm}$ and the overall averaged value $V_{dc}$. The zero-sequence voltage generating circuit 332 generates the zero-sequence voltage injection signal $v_{OM}$ according to a difference between the feedforward power and the feedback power. Embodiments will be provided below about the generation of the zero-sequence voltage injection signal $v_{OM}$.

The power flow induced by the zero-sequence voltage injection signal $v_{OM}$ is first analyzed. After the zero-sequence voltage injection signal $v_{OM}$ is injected, the phase voltages $v_{aM}$, $v_{bM}$ and $v_{cM}$ outputted by the power providing module 110 are defines as the following equation (2).

$$v_{aM} = v_{saO} + V_{OM}$$

$$v_{bM} = v_{sbO} + V_{OM}$$

$$v_{cM} = v_{scO} + V_{OM}$$

$$v_{OM} = V_{OM} \cos(\omega t + \gamma) \quad (2)$$

$V_{OM}$ denotes the magnitude of the zero-sequence voltage injection signal $v_{OM}$, $\gamma$ denotes the phase angle of the zero-sequence voltage injection signal $v_{OM}$, $\omega$ denotes an angular velocity, and t is a time variable. The voltages $V_a$, $V_b$ and $V_c$ across the inductors $L_{ac}$ (see FIG. 1) are small and neglected. Therefore, instantaneous power $p_{a0}$, $p_{b0}$, and $p_{c0}$ at each individual phase, which is induced by the zero-sequence voltage injection signal $v_{OM}$, is calculated by the following equation (3).

$$p_{a0} = v_{OM} \cdot i_a = \quad (3)$$
$$V_{OM} \cos(\omega t + \gamma) \cdot (\cos\omega t \cdot I_q^p + \sin\omega t \cdot I_d^p + \cos\omega t \cdot I_q^n - \sin\omega t \cdot I_d^n)$$

$$p_{b0} = v_{OM} \cdot i_b = V_{OM} \cos(\omega t + \gamma) \cdot$$
$$\left[ -\frac{1}{2} \cdot (\cos\omega t \cdot I_q^p + \sin\omega t \cdot I_d^p + \cos\omega t \cdot I_q^n - \sin\omega t \cdot I_d^n) - \right.$$
$$\left. \frac{\sqrt{3}}{2} \cdot (-\sin\omega t \cdot I_q^p + \cos\omega t \cdot I_d^p + \sin\omega t \cdot I_q^n + \cos\omega t \cdot I_d^n) \right]$$

$$p_{c0} = v_{OM} \cdot i_c = V_{OM} \cos(\omega t + \gamma) \cdot \left[ -\frac{1}{2} \cdot (\cos\omega t \cdot I_q^p + \sin\omega t \cdot I_d^p + \right.$$
$$\cos\omega t \cdot I_q^n - \sin\omega t \cdot I_d^n) + \frac{\sqrt{3}}{2} \cdot$$
$$\left. (-\sin\omega t \cdot I_q^p + \cos\omega t \cdot I_d^p + \sin\omega t \cdot I_q^n + \cos\omega t \cdot I_d^n) \right]$$

The DC terms of active power at each phase is then expressed the following equation (4).

$$P_{a0} = \left( \frac{V_{OM}}{2} \cos\gamma \cdot I_q^p - \frac{V_{OM}}{2} \sin\gamma \cdot I_d^p + \frac{V_{OM}}{2} \cos\gamma \cdot I_q^n + \frac{V_{OM}}{2} \cos\gamma \cdot I_d^n \right) \quad (4)$$

$$P_{b0} =$$
$$-\frac{1}{2} \cdot \left( \frac{V_{OM}}{2} \cos\gamma \cdot I_q^p - \frac{V_{OM}}{2} \sin\gamma \cdot I_d^p + \frac{V_{OM}}{2} \cos\gamma \cdot I_q^n + \frac{V_{OM}}{2} \sin\gamma \cdot I_d^n \right) -$$
$$\frac{\sqrt{3}}{2} \cdot \left( \frac{V_{OM}}{2} \sin\gamma \cdot I_q^p + \frac{V_{OM}}{2} \cos\gamma \cdot I_d^p - \right.$$
$$\left. \frac{V_{OM}}{2} \sin\gamma \cdot I_q^n + \frac{V_{OM}}{2} \cos\gamma \cdot I_d^n \right)$$

$$P_{c0} = -\frac{1}{2} \cdot \left( \frac{V_{OM}}{2} \cos\gamma \cdot I_q^p - \frac{V_{OM}}{2} \sin\gamma \cdot I_d^p + \frac{V_{OM}}{2} \cos\gamma \cdot I_q^n + \right.$$
$$\left. \frac{V_{OM}}{2} \sin\gamma \cdot I_d^n \right) + \frac{\sqrt{3}}{2} \cdot \left( \frac{V_{OM}}{2} \sin\gamma \cdot I_q^p + \right.$$
$$\left. \frac{V_{OM}}{2} \cos\gamma \cdot I_d^p - \frac{V_{OM}}{2} \sin\gamma \cdot I_q^n + \frac{V_{OM}}{2} \cos\gamma \cdot I_d^n \right)$$

It is worthy of mentioning that the summation of the real power $P_{a0}$, $P_{b0}$ and $P_{c0}$ is zero because there is no zero-sequence current flowing in the converter. In order to manage these power flows with the zero-sequence voltage injection signal, the equation (4) is modified as the following equation (5).

$$\begin{bmatrix} P_{\alpha 0} \\ P_{\beta 0} \end{bmatrix} = \frac{2}{3} \begin{bmatrix} 1 & -1/2 & -1/2 \\ 0 & -\sqrt{3}/2 & \sqrt{3}/2 \end{bmatrix} \begin{bmatrix} P_{a0} \\ P_{b0} \\ P_{c0} \end{bmatrix} = \quad (5)$$
$$\frac{1}{2} \begin{bmatrix} (I_q^p + I_q^n) & (-I_d^p + I_d^n) \\ (I_d^p + I_d^n) & (I_q^p - I_q^n) \end{bmatrix} \begin{bmatrix} V_{OM} \cos\gamma \\ V_{OM} \sin\gamma \end{bmatrix}$$

The equation (5) represents the relationships among the zero-sequence voltage injection signal $v_{OM}$, the real power $P_{\alpha 0}$, $P_{\beta 0}$, the positive-sequence current signals $I_q^p$, $I_d^p$, and the negative-sequence current signals $I_q^n$, $I_d^n$. Therefore, after the sensed voltage signals and the sensed current signals are obtained, the zero-sequence voltage injection signal $v_{OM}$ is calculated according to the following equation (6).

$$V_{OM} = \sqrt{(V_{OM}\cos\gamma)^2 + (V_{OM}\sin\gamma)^2} \quad (6)$$

$$\gamma = \begin{cases} \tan^{-1}\left(\dfrac{V_{OM}\sin\gamma}{V_{OM}\cos\gamma}\right) & \text{if } V_{OM}\cos\gamma \geq 0, \\ \tan^{-1}\left(\dfrac{V_{OM}\sin\gamma}{V_{OM}\cos\gamma}\right) + \pi & \text{if } V_{OM}\cos\gamma < 0 \text{ and } V_{OM}\sin\gamma \geq 0, \\ \tan^{-1}\left(\dfrac{V_{OM}\sin\gamma}{V_{OM}\cos\gamma}\right) - \pi & \text{if } V_{OM}\cos\gamma < 0 \text{ and } V_{OM}\sin\gamma < 0, \end{cases}$$

where $$\begin{bmatrix} V_{OM}\cos\gamma \\ V_{OM}\sin\gamma \end{bmatrix} = \dfrac{2}{(I_q^p)^2 + (I_d^p)^2 - (I_q^n)^2 - (I_d^n)^2} \cdot \begin{bmatrix} (I_q^p - I_q^n) & (I_d^p - I_d^n) \\ (-I_d^p - I_d^n) & (I_q^p + I_q^n) \end{bmatrix} \begin{bmatrix} P_{\alpha 0}^* \\ P_{\beta 0}^* \end{bmatrix}$$

$P^*_{\alpha 0}$ and $P^*_{\beta 0}$ denote the real power of the zero-sequence voltage injection signal $v_{OM}$. In the embodiment, the real power is calculated according to a difference between the feedback power of the multilevel converter module 120 and the feedforward power of the power providing module 110. The calculation of the feedback power and the feedforward power will be described below.

Figure 6:
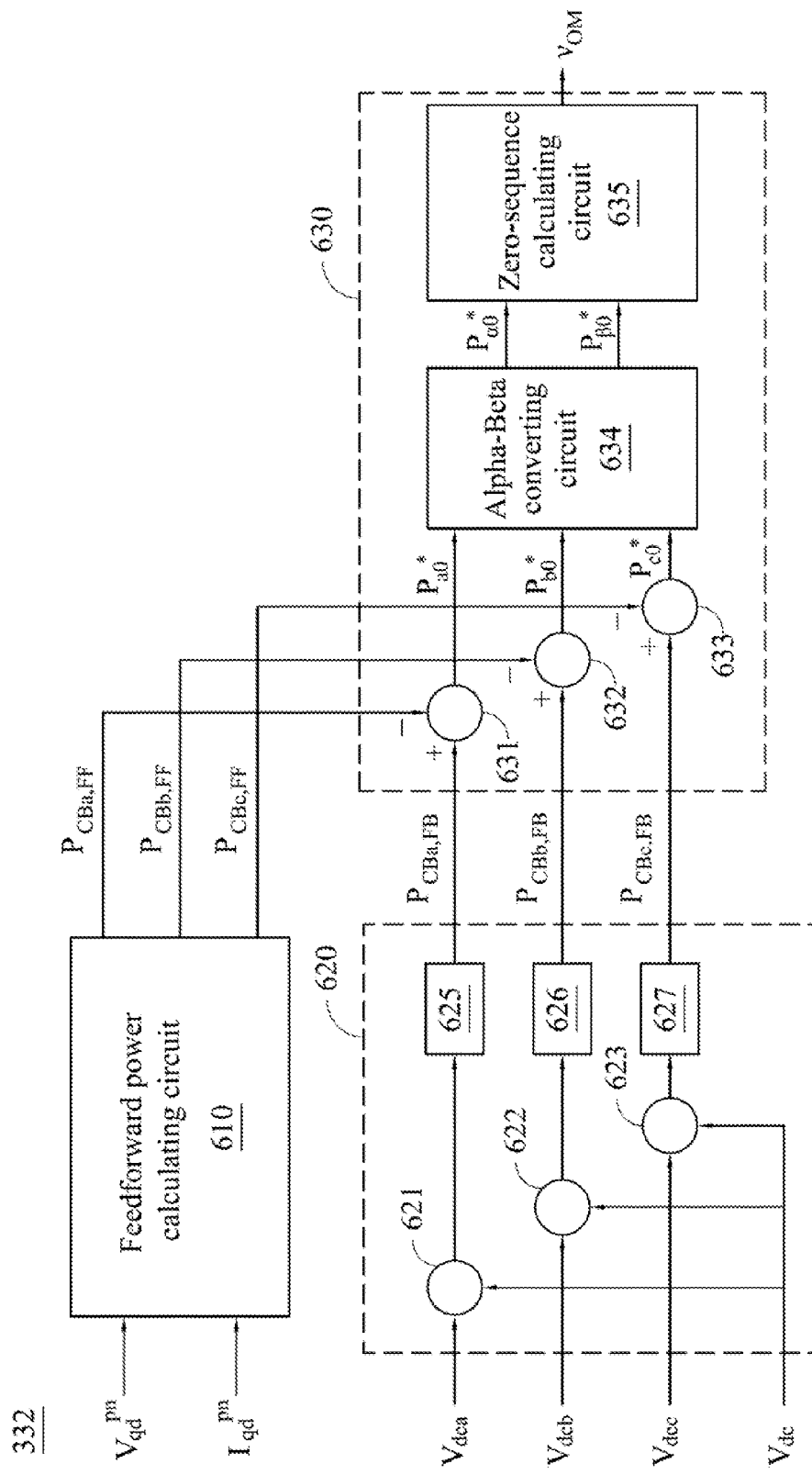
FIG. 6 is a block diagram illustrating the zero-sequence voltage generating circuit according to the first embodiment.

FIG. 6 is a block diagram illustrating the zero-sequence voltage generating circuit according to the first embodiment. Referring to FIG. 6, the zero-sequence voltage generating circuit 332 includes a feedforward power calculating circuit 610, a feedback power calculating circuit 620 and a zero-sequence voltage calculating circuit 630.

After the positive-sequence current signals and the negative-sequence current signals are injected, the injected current and the voltage outputted from the power providing module 110 lead to certain amounts of power flow at each phase. These power flows affect the SOC of the multilevel converter module 120. Therefore, the feedforward power calculating circuit 610 utilizes the zero-sequence voltage injection signal to compensate the induced plow flows. To be specific, the feedforward power calculating circuit 610 calculates feedforward power $P_{CBa,FF}$, $P_{CBb,FF}$, and $P_{CBc,FF}$ according to the following equation (7).

generates the feedback power $P_{CBb,FB}$ according to the second difference value. A subtractor 623 subtracts the third averaged value $V_{dcc}$ from the overall averaged value $V_{dc}$ to generate a third difference value, and transmits the third difference value to a proportional controller 627. The proportional controller 627 generates the feedback power $P_{CBc,FB}$ according to the third difference value.

Next, the zero-sequence voltage calculating circuit 630 calculates the zero-sequence voltage injection signal $v_{OM}$ according to the feedforward power $P_{CBa,FF}$, $P_{CBb,FF}$, and $P_{CBc,FF}$, and feedback power $P_{CBa,FB}$, $P_{CBb,FB}$, and $P_{CBc,FB}$. In detail, a subtractor 631 subtracts the feedforward power $P_{CBa,FF}$ from the feedback power $P_{CBa,FB}$ to generate a power command $P_{a0}^*$. A subtractor 632 subtracts the feedforward power $P_{CBb,FF}$ from the feedback power $P_{CBb,FB}$ to generate a power command $P_{b0}^*$. A subtractor 633 subtracts the feedforward power $P_{CBc,FF}$ from the feedback power $P_{CBc,FB}$ to generate a power command $P_{c0}^*$. In other words, the zero-sequence voltage calculating circuit 630 can generate the power commands according to the following equations (8).

$$P^*_{m0} = P_{CBm,FB} - P_{CBm,FF} \quad (8)$$

An alpha-beta converting circuit 634 performs an alpha-beta transform on the power commands $P_{a0}^*$, $P_{b0}^*$, and $P_{c0}^*$ to generate power commands $P_{\alpha 0}^*$ and $P_{\beta 0}^*$. However, people skilled in the art should understand the alpha-beta transform, and it will not be described. Herein, the power commands $P_{\alpha 0}^*$ and $P_{\beta 0}^*$ can be taken as the real power of the zero-sequence voltage injection signal $v_{OM}$.

At last, as written in the equation (6) above, the zero-sequence calculating circuit 635 determines the magnitude and the phase of the zero-sequence voltage injection signal $v_{OM}$ according to the power commands $P_{\alpha 0}^*$ and $P_{\beta 0}^*$, the positive-sequence current signals $I_q^p$, $I_d^p$, and the negative-sequence current signals $I_q^n$, and $I_d^n$.

Referring back to FIG. 3, the individual balancing controlling circuit 333 generates balanced voltage signals $V_{Ibmn}$ according to the DC voltage signals $V_{dcmn}$ and the averaged values $V_{dcm}$. To be specific, the individual balancing controlling circuit 333 can generate balanced voltage signals $$\begin{bmatrix} P_{CBa,FF} \\ P_{CBb,FF} \\ P_{CBc,FF} \end{bmatrix} = \begin{bmatrix} \dfrac{V_q^n}{2} & -\dfrac{V_d^n}{2} & \dfrac{V_q^p}{2} & -\dfrac{V_d^p}{2} \\ -\dfrac{V_q^n}{4} + \dfrac{\sqrt{3}V_d^n}{4} & \dfrac{\sqrt{3}V_q^n}{4} + \dfrac{V_d^n}{4} & -\dfrac{V_q^p}{4} + \dfrac{\sqrt{3}V_d^p}{4} & \dfrac{\sqrt{3}V_q^p}{4} + \dfrac{V_d^p}{4} \\ -\dfrac{V_q^n}{4} - \dfrac{\sqrt{3}V_d^n}{4} & -\dfrac{\sqrt{3}V_q^n}{4} + \dfrac{V_d^n}{4} & -\dfrac{V_q^p}{4} - \dfrac{\sqrt{3}V_d^p}{4} & -\dfrac{\sqrt{3}V_q^p}{4} + \dfrac{V_d^p}{4} \end{bmatrix} \begin{bmatrix} I_q^p \\ I_d^p \\ I_q^n \\ I_d^n \end{bmatrix} \quad (7)$$

The feedback power calculating circuit 620 calculates feedback power $P_{CBa,FB}$, $P_{CBb,FB}$, and $P_{CBc,FB}$ according to the first averaged value $V_{dca}$, the second averaged value $V_{dcb}$, the third averaged value $V_{dcc}$, and the overall averaged value $V_{dc}$. In detail, a subtractor 621 subtracts the first averaged value $V_{dca}$ from the overall averaged value $V_{dc}$ to generate a first difference value, and transmits the first difference value to a proportional controller 625. The proportional controller 625 generates the feedback power $P_{CBa,FB}$ according to the received difference value. A subtractor 622 subtracts the second averaged value $V_{dcb}$ from the overall averaged value $V_{dc}$ to generate a second difference value, and transmits the second difference value to a proportional controller 626. The proportional controller 626

$V_{IBan}$, $V_{IBbn}$, and $V_{IBcn}$ according to the following equation (9), where $K_{IB}$ is a real number but the invention does not limit its value.

$$v_{IBan} = K_{IB} \cdot (V_{dca} - V_{dcan}) \cdot i_a$$

$$v_{IBbn} = K_{IB} \cdot (V_{dcb} - V_{dcbn}) \cdot i_b$$

$$v_{IBcn} = K_{IB} \cdot (V_{dcc} - V_{dccn}) \cdot i_c \quad (9)$$

The current regulating circuit 340 receives the positive-sequence current commands $I_{qd}^{p*}$ and the negative-sequence current commands $I_{qd}^{n*}$, so as to track the current outputted from the converter to the assigned current commands by calculating the three-phase PWM reference voltage signals $v_{m,ref}$.

The calculating circuit 350 receives the reference voltage signals $v_{m,ref}$, zero-sequence voltage injection signal $v_{OM}$ and the balanced voltage signals $V_{Ibmn}$, and generates modulating reference signals $v_{mn,ref}$, according to the following equation (10). Then, the modulating module 134 can generate the modulated signal according to the modulating reference signals $v_{mn,ref}$ to control gates of the H bridge in the multilevel converter module 120.

$$v_{mn,ref} = \frac{1}{N} \cdot (v_{m,ref} + v_{OM}) + v_{IBmn} \tag{10}$$

Figure 7:
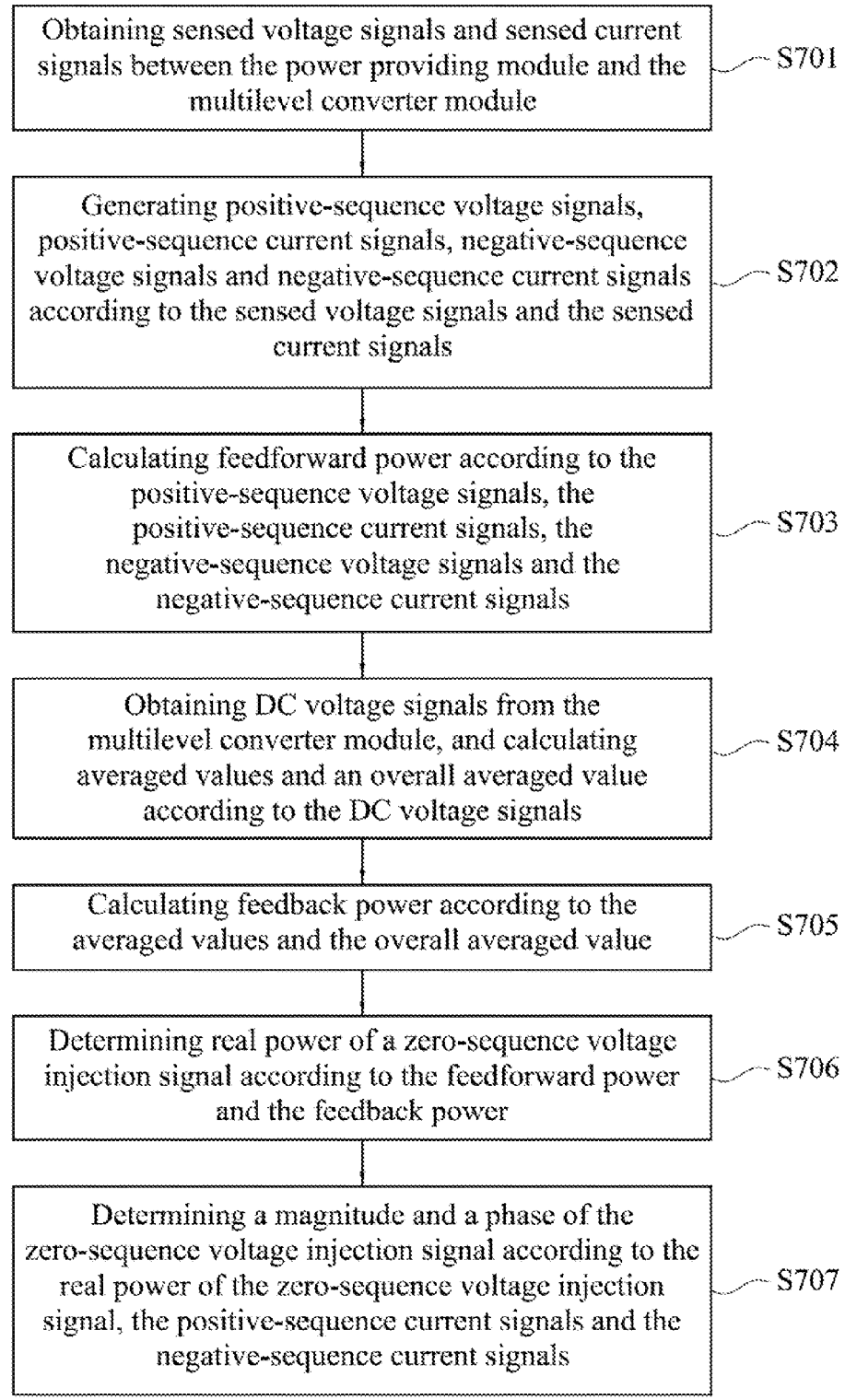
FIG. 7 is a flowchart of a power flow managing method according to the first embodiment.

FIG. 7 is a flowchart of a power flow managing method according to the first embodiment. Referring to FIG. 7, in a step S701, sensed voltage signals and sensed current signals between the power providing module and the multilevel converter module are obtained. In a step S702, positive-sequence current signals, negative-sequence voltage signals and negative-sequence current signals are generated according to the sensed voltage signals and the sensed current signals. In a step S703, feedforward power is calculated according to the positive-sequence voltage signals, the positive-sequence current signals, the negative-sequence voltage signals and the negative-sequence current signals. In a step S704, DC voltage signals are obtained from the multilevel converter module, and averaged values and an overall averaged value are calculated according to the averaged value and the overall averaged value. In a step S705, feedback power is calculated according to the averaged values and the overall averaged value. In a step S706, real power of a zero-sequence voltage injection signal is determined according to the feedforward power and the feedback power. In a step S707, a magnitude and a phase of the zero-sequence voltage injection signal are determined according to the real power of the zero-sequence voltage injection signal, the positive-sequence current signals and the negative-sequence current signals.

However, each step in FIG. 7 has been described above, and they will not be repeated. Note that each step in FIG. 7 can be implemented as program codes or circuits, which is not limited in the invention. In addition, the method in FIG. 7 can be performed with the said embodiments or performed independently. The steps in FIG. 7 can also switches with each other. For example, the steps S702 and S703 can be performed after the steps S704 and S705.

Second Embodiment

Only the difference between the second embodiment and the first embodiment is described here. The second embodiment provides a fault tolerant method to improve the fault tolerance capability of the power system 100. Referring back to FIG. 1, in the second embodiment, the positive-sequence currents are for the overall output reactive power (denoted as $Q_T$ hereinafter) and for controlling the average DC voltage; the negative sequence currents are for a clustered voltage balancing control, and zero-sequence voltage is for a fault tolerant control.

Figure 8:
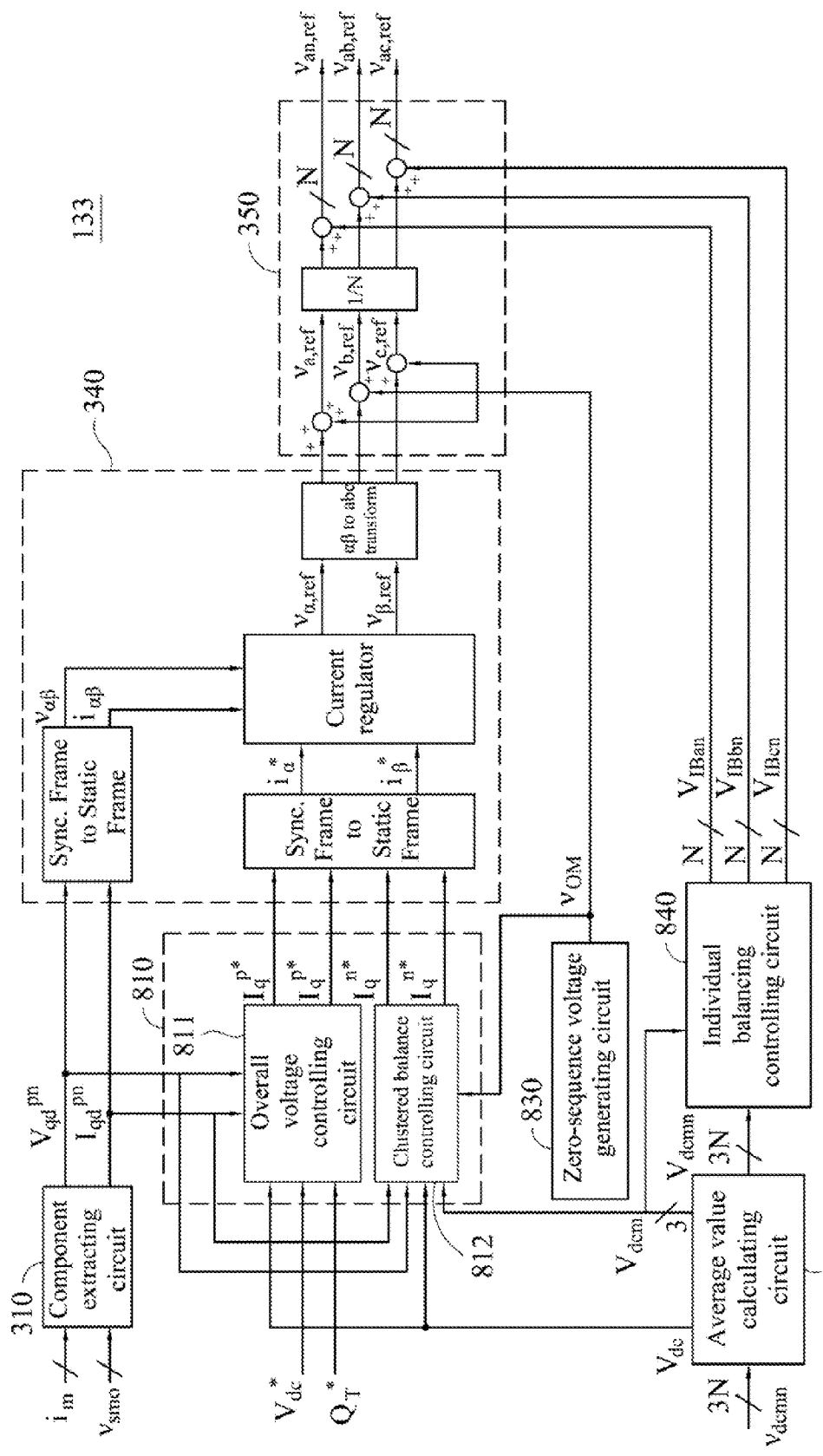
FIG. 8 is a block diagram of the controller according to a second embodiment.

FIG. 8 is a block diagram of the controller according to a second embodiment. Referring to FIG. 8, in the second embodiment, the controller 133 includes the component extracting circuit 310, a current command generating circuit 810, a zero-sequence voltage generating circuit 830, the average value calculating circuit 331, an individual balancing controlling circuit 840, a current regulating circuit 340 and the calculating circuit 350. The operations of the component extracting circuit 310, the average value calculating circuit 331, the current regulating circuit 340 and the calculating circuit 350 have been described and they will not be repeated.

In the current regulating circuit 340, the positive-sequence voltage signals $V_{qd}^p$, the positive-sequence current signals $I_{qd}^p$ are transformed into voltages $v_{\alpha\beta}$ and currents $i_{\alpha\beta}$. The positive-sequence current commands $I_{qd}^{p*}$, the negative-sequence current commands $I_{qd}^{n*}$ are transformed into current commands $i_\alpha^*$ and $i_\beta^*$, the current regulator accordingly generates voltages $v_{\alpha,ref}$ and $v_{\beta,ref}$. However, people skilled in the art should understand the synchronization frame to static frame transform, it will be described herein.

Figure 9:
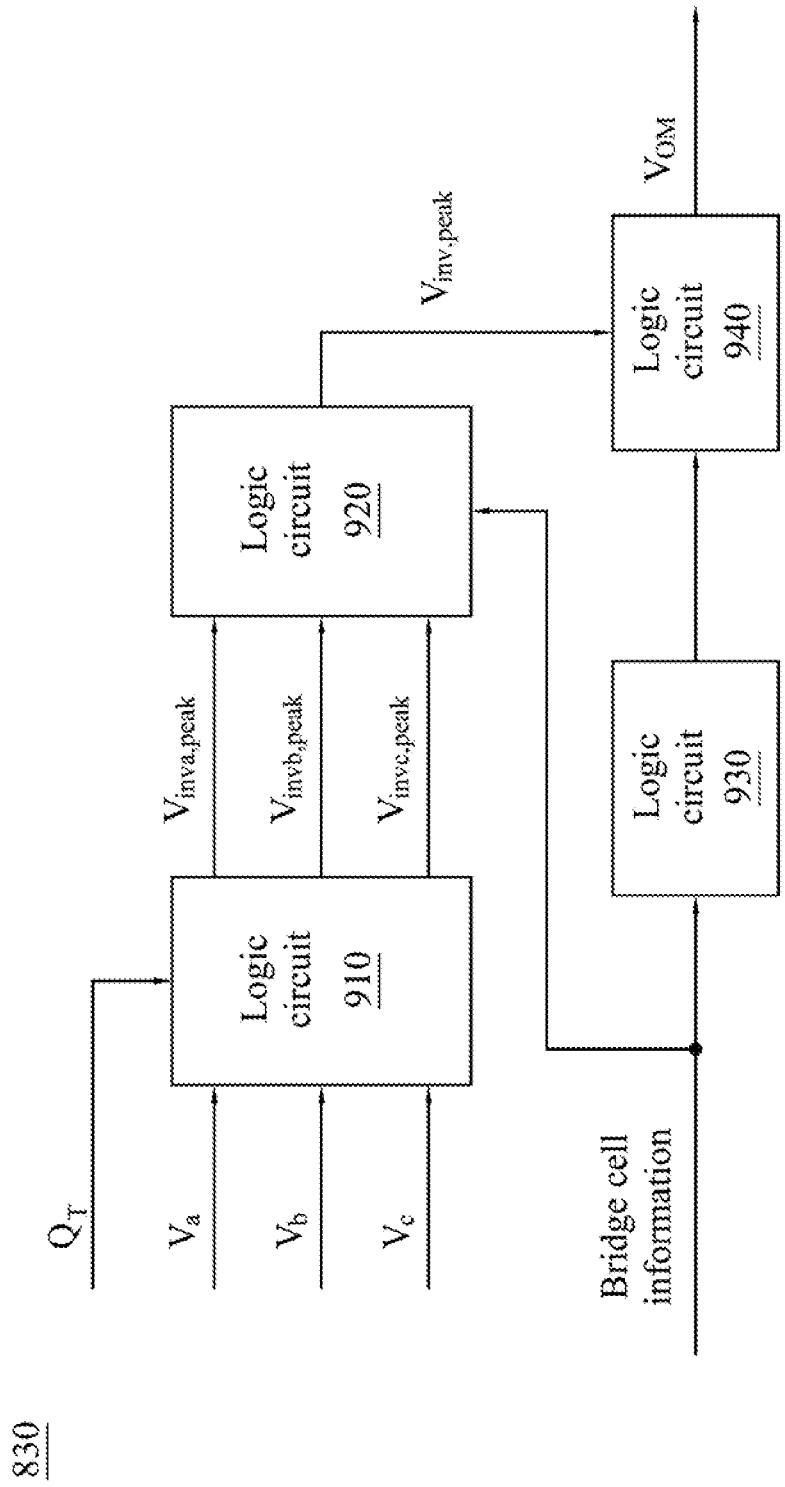
FIG. 9 is a block diagram of the zero-sequence voltage generating circuit according to the second embodiment.
Figure 10:
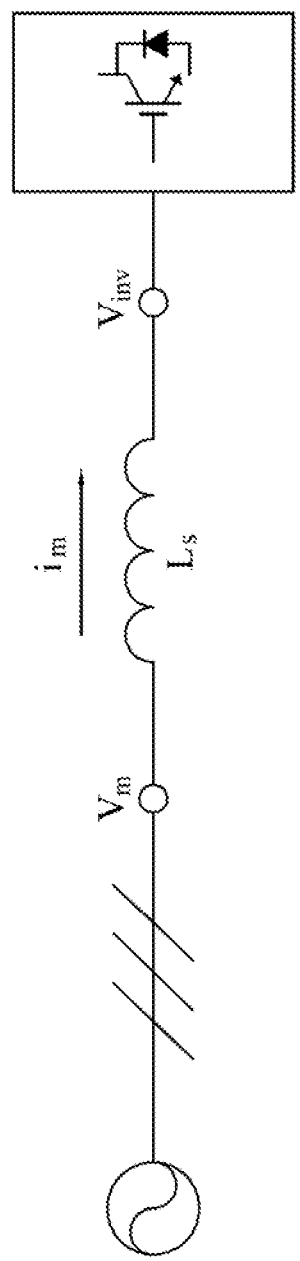
FIG. 10 is a schematic diagram illustrating a single line of the STATCOM according to the second embodiment.

FIG. 9 is a block diagram of the zero-sequence voltage generating circuit according to the second embodiment. FIG. 10 is a schematic diagram illustrating a single line of the STATCOM according to the second embodiment. Referring to FIG. 9 and FIG. 10, the inductors $L_s$ are disposed between the grid and the STATCOM. The voltages $V_m$ and $V_{inv}$ are across the inductors $L_s$. Since the grid-connected PWM converter is like a current-control voltage source, a logic circuit 910 can calculate converter outputting voltages $V_{invm,peak}$ of the PWM converter according to the following equation (11), where $Q_T$ is reactive power and $\omega$ is an electrical frequency.

$$V_{invm,peak} = \sqrt{2}\, v_{inv} = \sqrt{2}\, (v_m + i_m \cdot \omega L_s), \tag{11}$$

where $$i_m = \frac{Q_T}{3v_m}$$

Figure 11:
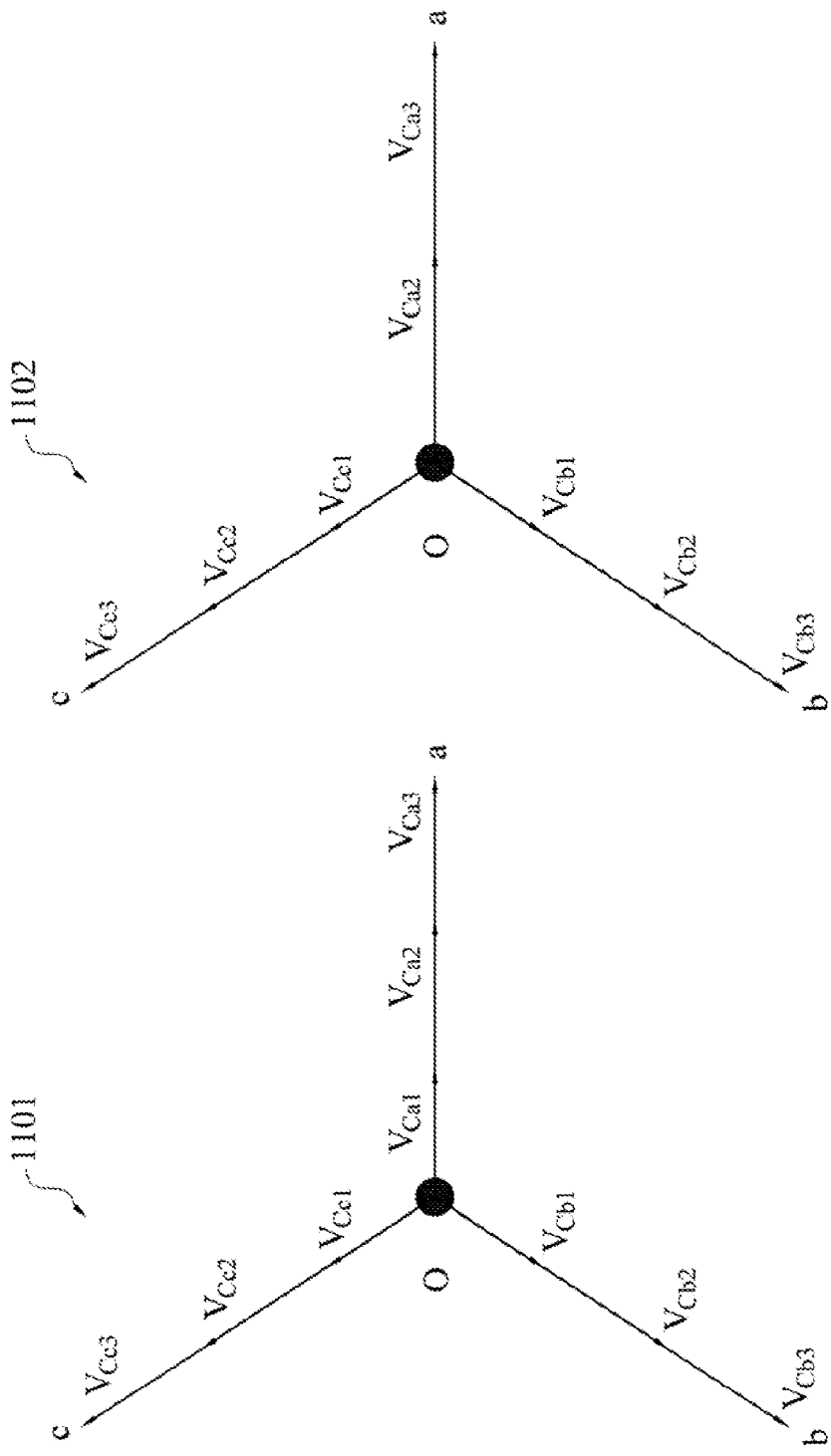
FIG. 11 is a schematic diagram illustrating phases of the multilevel converter module according to the second embodiment.

FIG. 11 is a schematic diagram illustrating phases of the multilevel converter module according to the second embodiment. Referring to FIG. 11, a phase diagram 1101 including an original point O and phases "a", "b" and "c", shows that the voltages $V_{Ca1}$-$V_{Ca3}$, $V_{Cb1}$-$V_{Cb3}$ and $V_{Cc1}$-$V_{Cc3}$, across the bridge cells on each phase in the multilevel converter module 120 are uniform under a normal situation. However, in the phase diagram 1102, if a bridge cell on the "a" phase is bypassed, the other bridge cells on the "a" phase need to shoulder greater voltages. Therefore, referring back to FIG. 9, a logic circuit 930 receives bridge cell information, which indicates whether the bridge cells are damaged, and limits the magnitude and the phase of the zero-sequence voltage injection signal $v_{OM}$ according to bridge cell information. To be specific, the logic circuit 930 calculates the zero-sequence voltage injection signal $v_{OM}$ according to the following equation (12).

$$v_{OM} = -|V_{OM}|\cos(\omega t + \gamma), \tag{12}$$

where $$\gamma = \begin{cases} 0, & \text{if broken bridge cell in phase "a"} \\ -\frac{2\pi}{3}, & \text{if broken bridge cell in phase "b"} \\ \frac{2\pi}{3}, & \text{if broken bridge cell in phase "c"} \end{cases}$$

Figure 12:
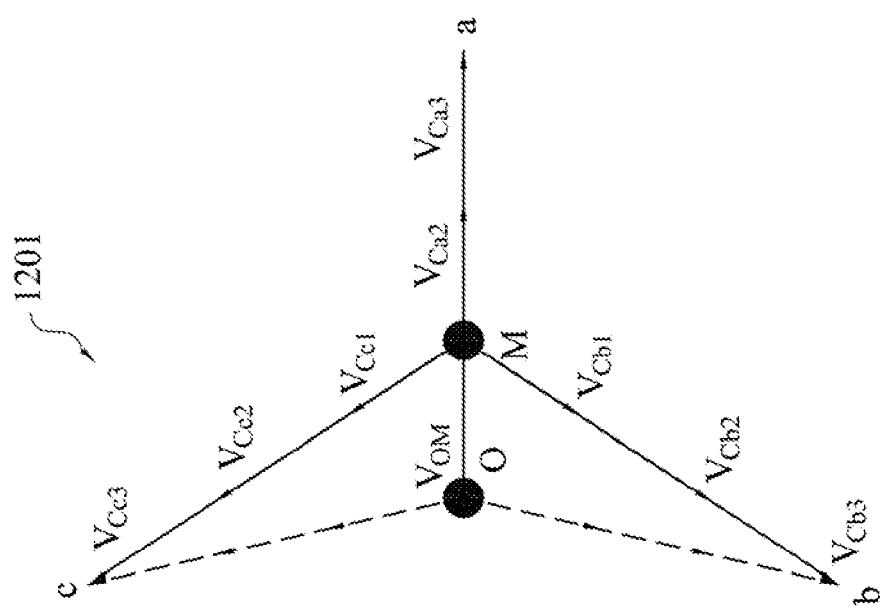
FIG. 12 is a schematic diagram illustrating phases after the zero-sequence voltage injection signal is added according to the second embodiment.

FIG. 12 is a schematic diagram illustrating phases after the zero-sequence voltage injection signal is added according to the second embodiment. Referring to FIG. 12, phase diagram 1201 shows that the required voltages on the "a" phase are decreased after the zero-sequence voltage injection signal $v_{OM}$ are injected, but the voltages required on the "b" and "c" phases are increased. Therefore, referring back to FIG. 9, a selection circuit 920 selects a voltage $V_{inv,peak}$ corresponding to the damaged bridge cell from the converter outputting voltages $V_{invn,peak}$, $V_{inva,peak}$ and $V_{inva,peak}$ according to the bridge cell information. A logic circuit 940 determines a limit of the magnitude of the zero-sequence voltage injection signal $v_{OM}$ according to the overall averaged value and the selected converter outputting voltage $V_{inv,peak}$. To be specific, the logic circuit 940 limits the magnitude of the zero-sequence voltage injection signal $v_{OM}$ according to the following equations (13) and (14).

$$|V_{OM}| \geq V_{inv,peak} - 2V_{dc} \quad (13)$$

$$|V_{OM}| \leq \sqrt{9V_{dc}^2 - \frac{3}{4}V_{inv,peak}^2} - \frac{1}{2}V_{inv,peak} \quad (14)$$

Figure 13:
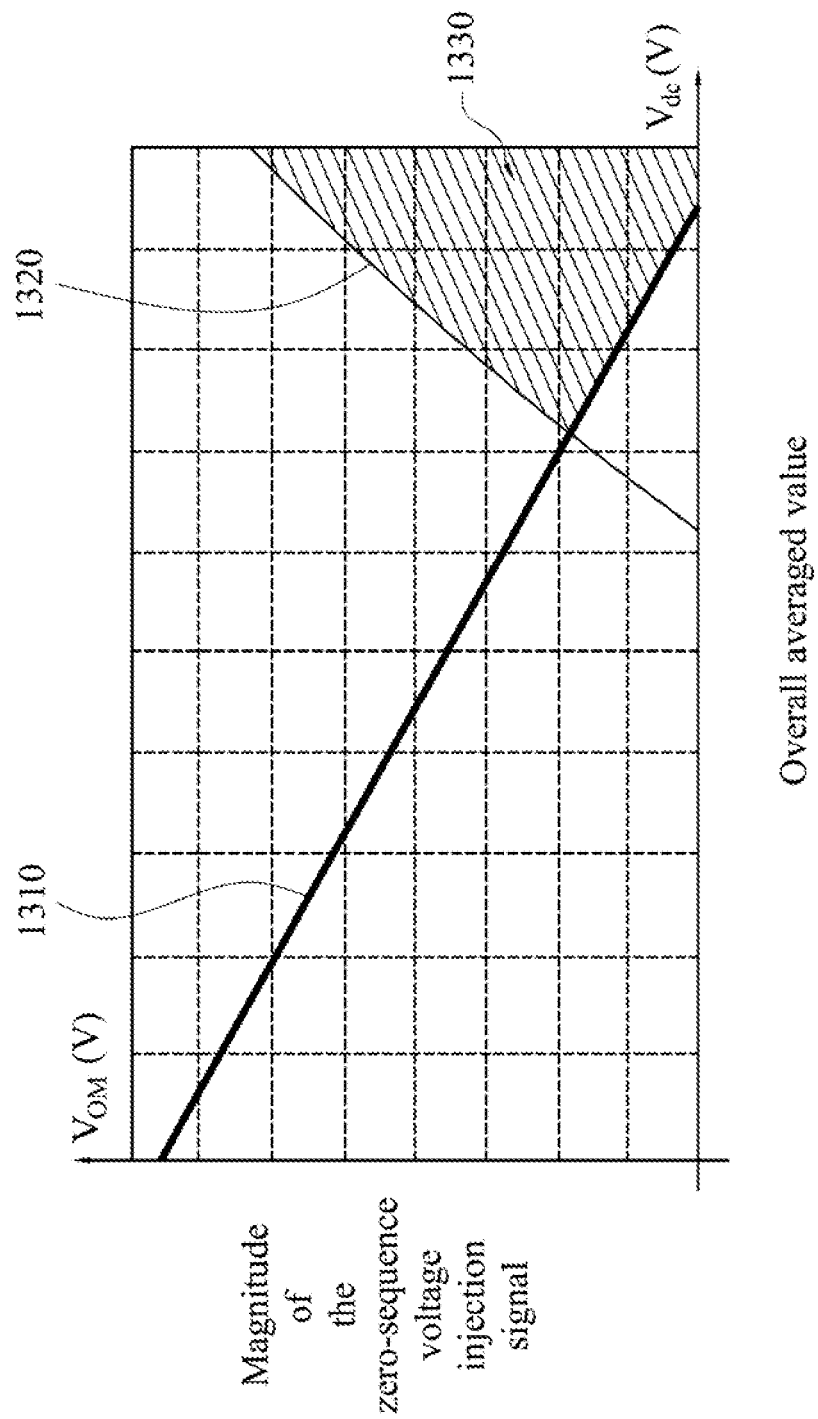
FIG. 13 is a schematic diagram illustrating the magnitude of the zero-sequence voltage injection signal according to the second embodiment.

FIG. 13 is a schematic diagram illustrating the magnitude of the zero-sequence voltage injection signal according to the second embodiment. Referring to FIG. 13, the horizontal axis represents the overall averaged value, and the vertical axis represents the magnitude of the zero-sequence voltage injection signal $v_{OM}$. A line 1310 is corresponding to the equation (13), and a line 1320 is corresponding to the equation (14). The magnitude of the zero-sequence voltage injection signal $v_{OM}$ is set to be in the area 1330.

Referring back to FIG. 8, in the second embodiment, the voltage balancing control can be separated into three layers. The first layer is an overall voltage control, corresponding to an overall voltage controlling circuit 811, to control the DC voltage of voltage commands. The second layer is a clustered voltage balancing control, corresponding to a clustered balance controlling circuit 812, to balance the voltages between each phase of the converter. The third layer is an individual voltage balancing control, corresponding to an individual balancing controlling circuit 840, to balance the voltages between each bridge cell in each cluster. The voltage controls in every layer will be described below.

Figure 14:
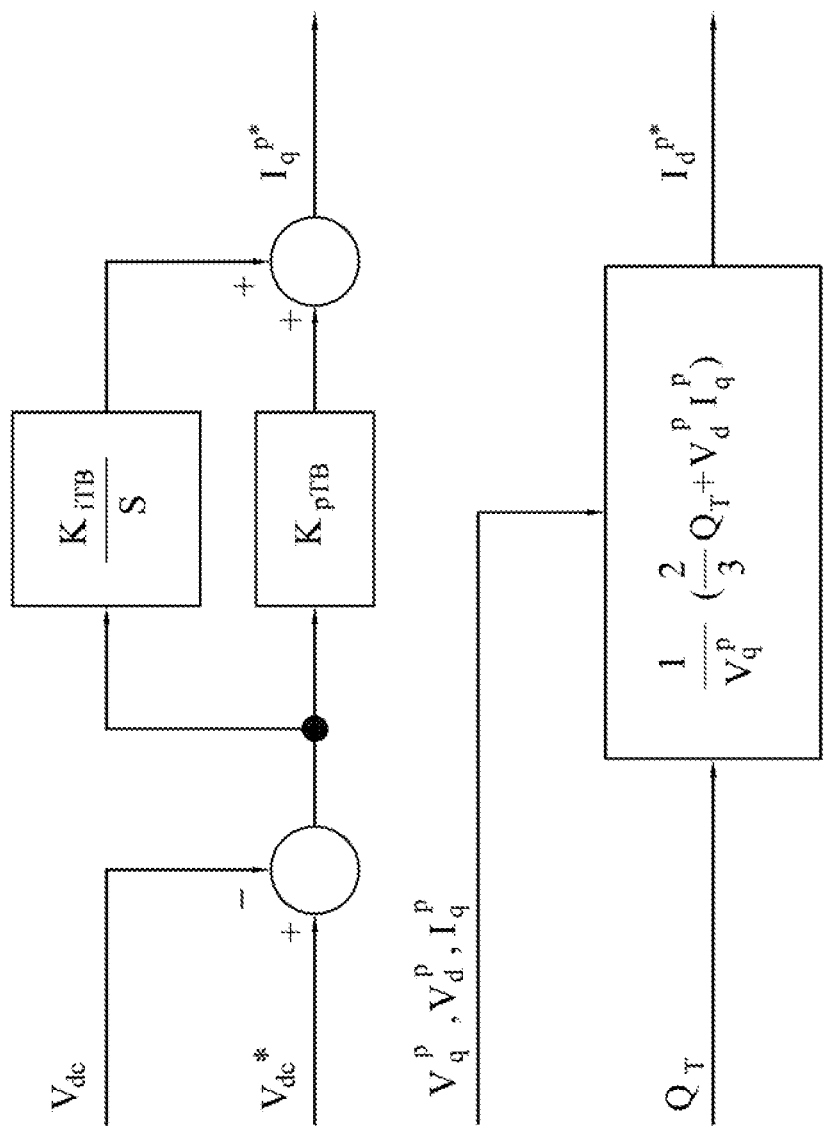
FIG. 14 is a block diagram of the overall voltage controlling circuit 811 according to the second embodiment.

FIG. 14 is a block diagram of the overall voltage controlling circuit 811 according to the second embodiment. Referring to FIG. 14, the overall voltage controlling circuit 811 controls the overall voltage and overall reactive power according to the positive-sequence current, in which $K_{iTB}$ and $K_{pTB}$ are real number but the invention does not limit their values. To be specific, a positive-sequence active current command $I_q^{p*}$ is generated by taking the voltage error; and a positive-sequence reactive current command $I_d^{p*}$ is calculated by an instantaneous power theory.

Figure 15:
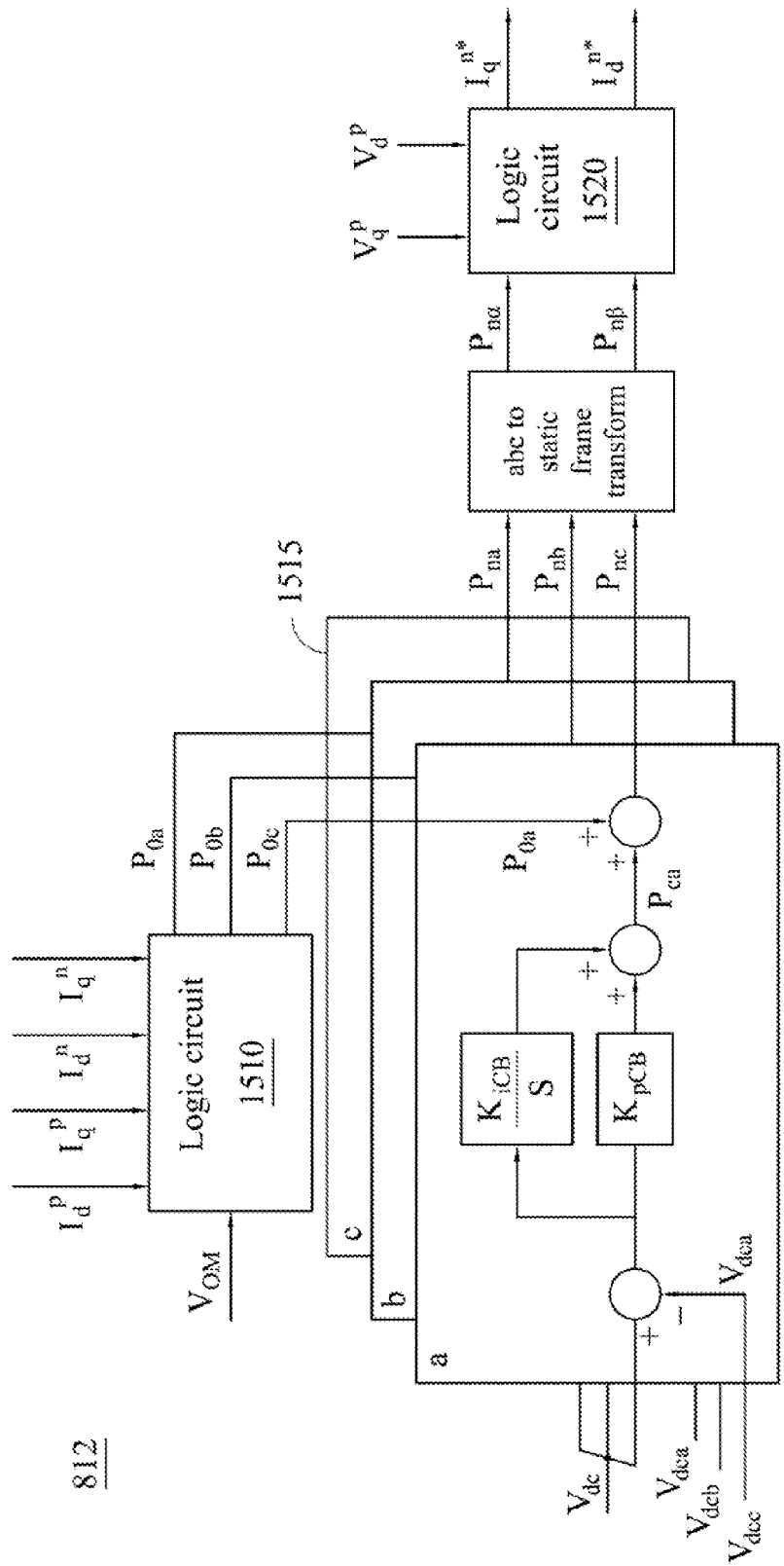
FIG. 15 is a block diagram of the clustered balance controlling circuit according to the second embodiment.

FIG. 15 is a block diagram of the clustered balance controlling circuit according to the second embodiment. Referring to FIG. 15, a logic circuit 1510 receives the zero-sequence voltage injection signal $v_{OM}$, and calculates power $P_{0a}$, $P_{0b}$, and $P_{0c}$ according to the following equation (15).

$$\begin{bmatrix} P_{0a} \\ P_{0b} \\ P_{0c} \end{bmatrix} = \begin{bmatrix} -\frac{1}{2}I_q^p & \frac{1}{2}I_d^p \\ \frac{1}{4}I_q^p + \frac{\sqrt{3}}{4}I_d^p & -\frac{1}{4}I_d^p + \frac{\sqrt{3}}{4}I_q^p \\ \frac{1}{4}I_q^p - \frac{\sqrt{3}}{4}I_d^p & -\frac{1}{4}I_d^p - \frac{\sqrt{3}}{4}I_q^p \end{bmatrix} \begin{bmatrix} |V_{OM}|\cos\gamma \\ |V_{OM}|\sin\gamma \end{bmatrix} \quad (15)$$

Next, a logic circuit 1515 calculates power $P_{na}$, $P_{nb}$, and $P_{nc}$ according to the following equation (16). In order to simplify the calculation, the three-phase compensating power $P_{na}$, $P_{nb}$, and $P_{nc}$ is transformed into a state frame as power $P_{n\alpha}$, and $P_{n\beta}$.

$$\begin{bmatrix} P_{n\alpha} \\ P_{n\beta} \end{bmatrix} = \frac{1}{2}\begin{bmatrix} V_q^p - |V_{OM}|\cos\gamma & -V_d^p - |V_{OM}|\sin\gamma \\ -V_d^p + |V_{OM}|\sin\gamma & -V_q^p - |V_{OM}|\cos\gamma \end{bmatrix}\begin{bmatrix} I_q^n \\ I_d^n \end{bmatrix} \quad (16)$$

At last, a logic circuit 1520 calculates current commands $I_q^{n*}$, and $I_d^{n*}$ according to the following equation (17).

$$\begin{bmatrix} I_q^{n*} \\ I_d^{n*} \end{bmatrix} = \quad (17)$$

$$\frac{2}{V^{p2} - |V_{OM}|^2}\begin{bmatrix} V_q^p + |V_{OM}|\cos\gamma & -V_d^p - |V_{OM}|\sin\gamma \\ -V_d^p + |V_{OM}|\sin\gamma & -V_q^p + |V_{OM}|\cos\gamma \end{bmatrix}\begin{bmatrix} P_{n\alpha} \\ P_{n\beta} \end{bmatrix},$$

where $$V^p = \sqrt{V_d^{p2} + V_d^{p2}}$$

Figure 16:
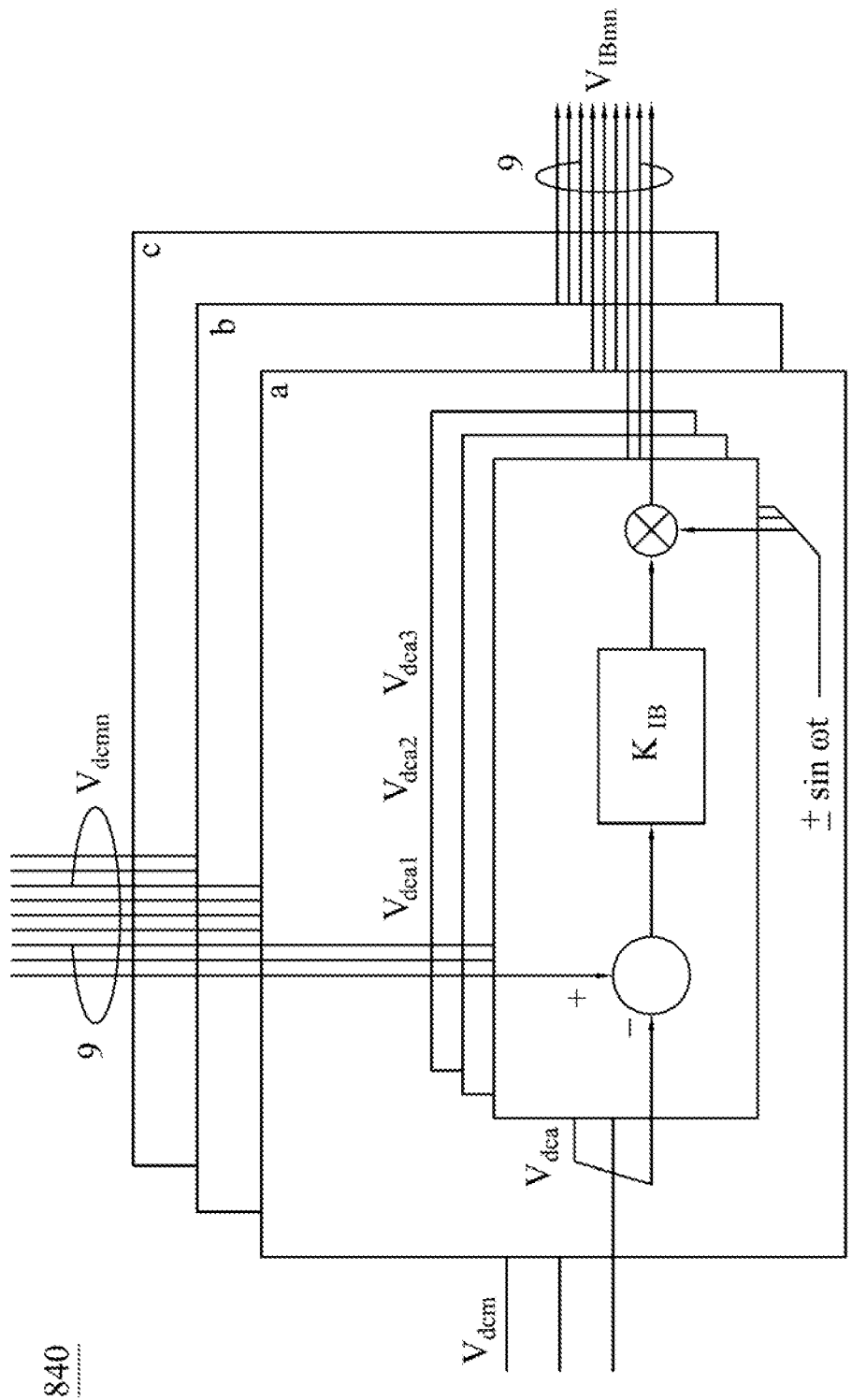
FIG. 16 is a schematic diagram illustrating the individual balancing controlling circuit according to the second embodiment.

FIG. 16 is a schematic diagram illustrating the individual balancing controlling circuit according to the second embodiment. Referring to FIG. 16, the individual balancing controlling circuit 840 generates balanced voltage signals $V_{Ibn}$ according to the averaged values. To be specific, the individual balancing controlling circuit 840 calculates the balanced voltage signals $V_{Ibn}$ according to the following equation (18).

$$V_{IBn} = \begin{cases} K_{IB}(V_{dcn} - V_{dcnm})\sin\left(\omega t + k\frac{2}{3}\pi\right), & \text{if } Q_T > 0 \\ -K_{IB}(V_{dcn} - V_{dcnm})\sin\left(\omega t + k\frac{2}{3}\pi\right), & \text{if } Q_T < 0 \end{cases} \quad (18)$$

where $$k = \begin{cases} 0, & \text{if } n = a \\ 1, & \text{if } n = b \\ -1, & \text{if } n = c \end{cases}$$

Third Embodiment

Only the difference between the third embodiment and the first embodiment, and the difference between the third embodiment and the second embodiment are described. The third embodiment provides a peak current limiting method. In the third embodiment, $V^p$ represents the magnitude of the positive-sequence voltage, $V^n$ represents the magnitude of the negative-sequence voltage, and $V_{OM}$ represents the magnitude of the zero-sequence voltage. $I^p$ represents the magnitude of the positive-sequence current, $I^n$ represents the magnitude of the negative-sequence current. $\theta_1$ represents the phase (angle) of the positive-sequence voltage, $\theta_2$ represents the phase of the negative-sequence voltage, $\theta_p$ represents the phase of the positive-sequence current, $\theta_n$ represents the phase of the negative-sequence current, $\gamma$ represents the phase of the zero-sequence voltage. The symbols discussed here are used in the following equations (19)-(22).

$$v_a = V^p \cos(\omega t + \theta_1) + V^n \cos(-\omega t + \theta_2) + V_{OM} \cos(\omega t + \gamma) \quad (19)$$

$$v_b = V^p \cos\left(\omega t - \frac{2}{3}\pi + \theta_1\right) +$$

$$V^n \cos\left(-\omega t - \frac{2}{3}\pi + \theta_2\right) + V_{OM} \cos(\omega t + \gamma)$$

$$v_b = V^p \cos\left(\omega t + \frac{2}{3}\pi + \theta_1\right) + V^n \cos\left(-\omega t + \frac{2}{3}\pi + \theta_2\right) +$$

$$V_{OM} \cos(\omega t + \gamma)$$

$$i_a = I^p \cos(\omega t + \theta_p) + I^n \cos(-\omega t + \theta_n) \quad (20)$$

$$i_b = I^p \cos\left(\omega t - \frac{2}{3}\pi + \theta_p\right) + I^n \cos\left(-\omega t - \frac{2}{3}\pi + \theta_n\right)$$

$$i_c = I^p \cos\left(\omega t + \frac{2}{3}\pi + \theta_p\right) + I^n \cos\left(-\omega t + \frac{2}{3}\pi + \theta_n\right)$$

$$\begin{bmatrix} v_\alpha \\ v_\beta \end{bmatrix} = \begin{bmatrix} \frac{2}{3} & -\frac{1}{3} & -\frac{1}{3} \\ 0 & -\frac{1}{\sqrt{3}} & \frac{1}{\sqrt{3}} \end{bmatrix} \begin{bmatrix} v_a \\ v_b \\ v_c \end{bmatrix} \quad (21)$$

$$\begin{bmatrix} v_q^p \\ v_d^p \end{bmatrix} = \begin{bmatrix} \cos\omega t & -\sin\omega t \\ \sin\omega t & \cos\omega t \end{bmatrix} \begin{bmatrix} v_\alpha \\ v_\beta \end{bmatrix}$$

$$\begin{bmatrix} v_q^n \\ v_d^n \end{bmatrix} = \begin{bmatrix} \cos\omega t & \sin\omega t \\ -\sin\omega t & \cos\omega t \end{bmatrix} \begin{bmatrix} v_\alpha \\ v_\beta \end{bmatrix}$$

$$\theta_1 = -\tan^{-1}\left(\frac{V_d^p}{V_q^p}\right) \quad (22)$$

$$\theta_2 = -\tan^{-1}\left(\frac{V_d^n}{V_q^n}\right)$$

$$\theta_p = -\tan^{-1}\left(\frac{I_d^p}{I_q^p}\right)$$

$$\theta_n = -\tan^{-1}\left(\frac{I_d^n}{I_q^n}\right)$$

$$V^p = \sqrt{(V_q^p)^2 + (V_d^p)^2}$$

$$V^n = \sqrt{(V_q^n)^2 + (V_d^n)^2}$$

$$I^p = \sqrt{(I_q^p)^2 + (I_d^p)^2}$$

$$I^n = \sqrt{(I_q^n)^2 + (I_d^n)^2}$$

Figure 17:
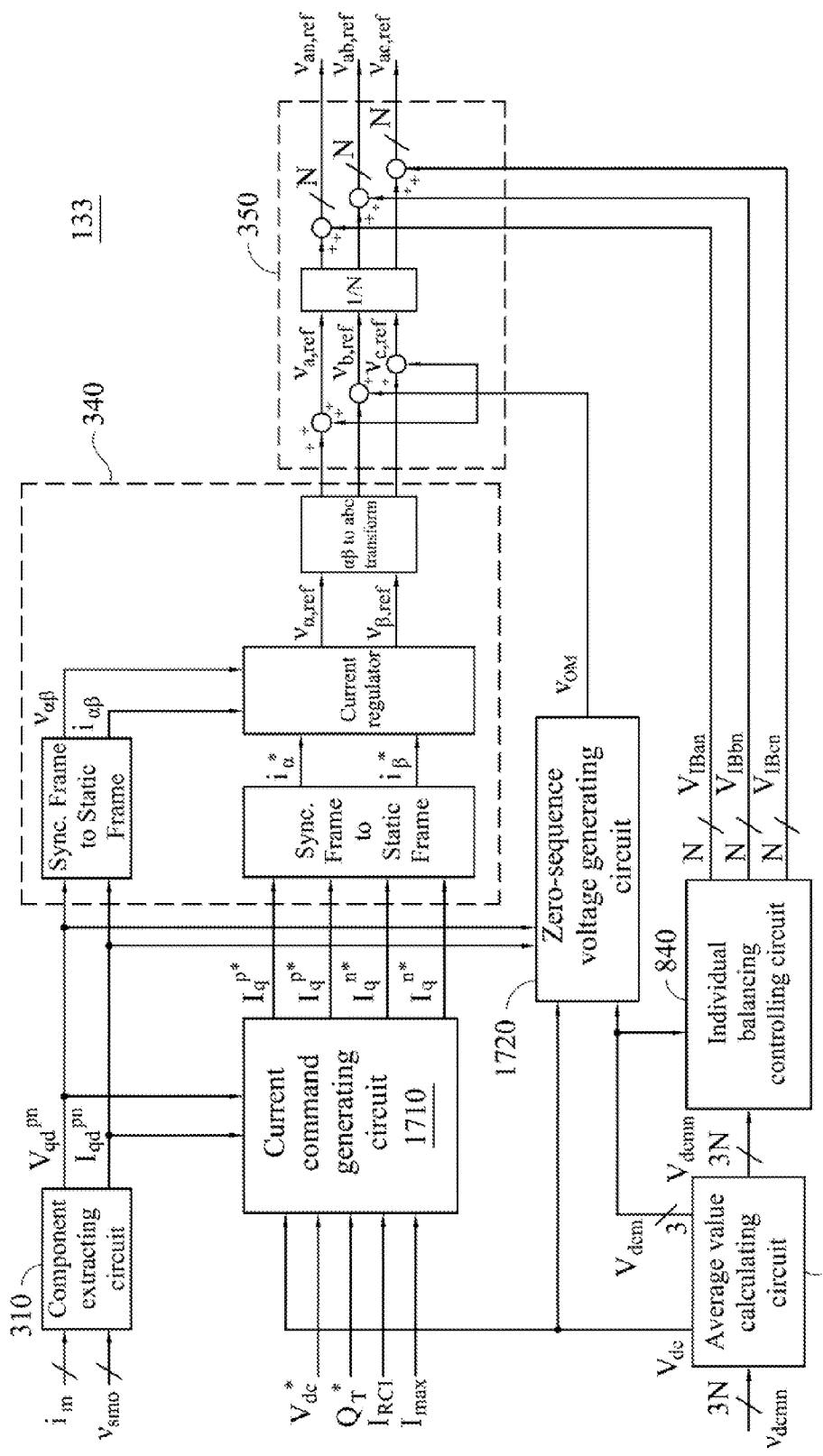
FIG. 17 is block diagram of the controller according to a third embodiment.

FIG. 17 is block diagram of the controller according to a third embodiment. Referring to FIG. 17, in the third embodiment, the controller 133 includes the component extracting circuit 310, a current command generating circuit 1710, a zero-sequence voltage generating circuit 1720, the average value calculating circuit 331, the current regulating circuit 340, the individual balancing controlling circuit 840 and the calculating circuit 350. The operations of the component extracting circuit 310, the average value calculating circuit 331, the individual balancing controlling circuit 840, the current regulating circuit 340 and the calculating circuit 350 have been described above and they will not be repeated.

Figure 18:
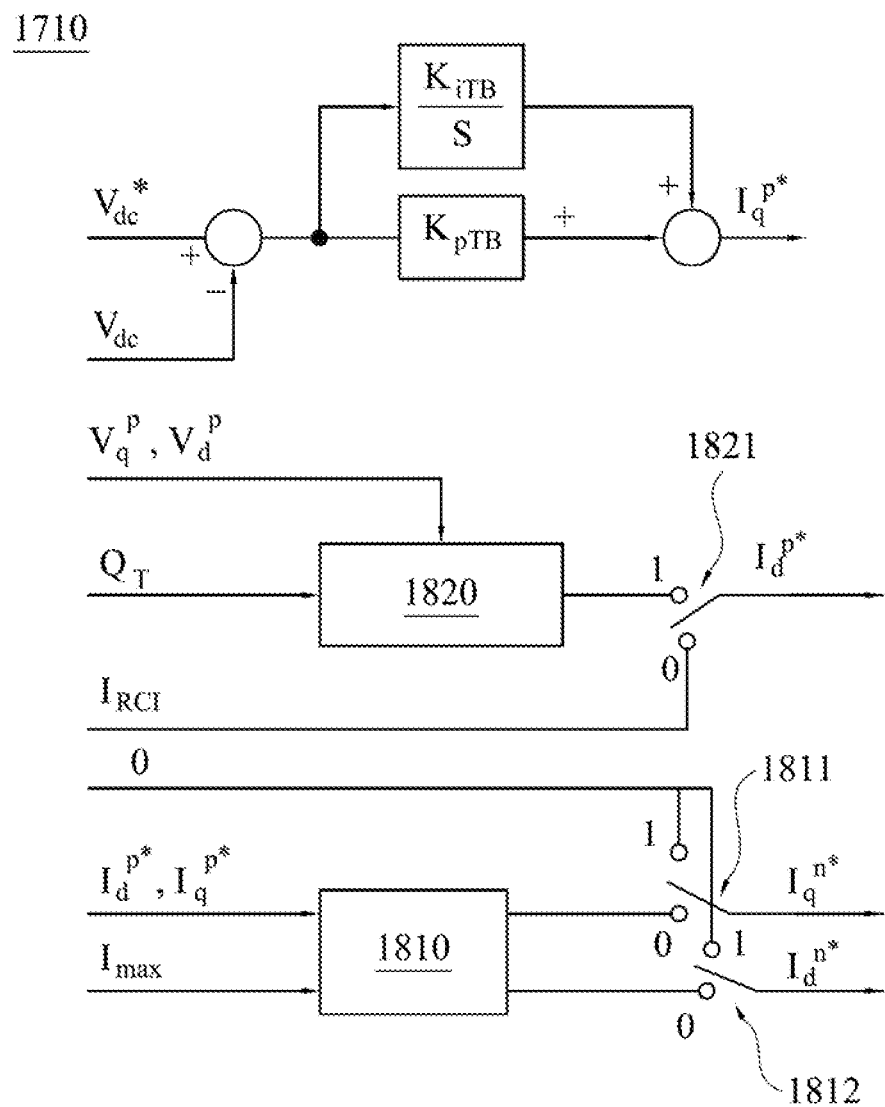
FIG. 18 is a block diagram of the current command generating circuit according to the third embodiment.

FIG. 18 is a block diagram of the current command generating circuit according to the third embodiment. Referring to FIG. 18, when a voltage sag occurs, switches 1811, 1812 and 1821 are switched to "0", at this time a positive-sequence current is injected for low voltage ride-though (LVRT) required current injection (RCI). In addition, the current command generating circuit 1710 injects the induced a negative-sequence current to reduce the magnitude of the negative-sequence voltage and uses a peak upper limit (denoted as $I_{max}$) of the overall current to control the magnitude of the negative-sequence current. In detail, a logic circuit 1810 determines the magnitude of the negative-sequence current according to the phase $\theta_n$ of the negative-sequence current, the phase $\theta_p$ of the positive-sequence current and the peak upper limit $I_{max}$, as written in the following equations (23) and (24), where $\theta_2$ is the phase of the negative-sequence voltage.

$$|I^n| = -I^p \cos\left(\alpha + k\frac{4\pi}{3}\right) + \sqrt{(I^p)^2 \left[\cos^2\left(\alpha + k\frac{4\pi}{3}\right)\right] + I_{max}^2}, \quad (23)$$

where $$k = \begin{cases} 0, -\frac{\pi}{3} \leq \alpha \leq \frac{\pi}{3} \\ 1, \frac{\pi}{3} \leq \alpha \leq \pi \\ -1, \pi \leq \alpha \leq \frac{5\pi}{3} \end{cases}$$

$$\theta_n = \theta_2 + \frac{\pi}{2}, \quad (24)$$

$$\alpha = \theta_p + \theta_n,$$

$$I_q^{n*} = |I^n| \cos\theta_n,$$

$$I_d^{n*} = -|I^n| \sin\theta_n$$

In the third embodiment, the voltage balance control is separated as three layers. The first layer is an overall voltage control. The second layer is a cluster voltage control, and the third layer is an individual voltage control. Herein, the positive-sequence current is for STATCOM operation and the overall voltage control; the inductive negative-sequence current balances grid voltage during LVRT operation; the zero-sequence voltage injection signal is for clustered voltage balancing control.

As the voltage sag occurs, the unbalanced voltage and current may generate unbalanced power between each phase of the converter. After the negative-sequence current command and the positive-sequence current command are determined, the converter still has one control of freedom, which is the zero-sequence voltage injection signal $v_{OM}$, to balance the cluster voltage. Therefore, the voltages outputted from the converter are multiplied by corresponding currents for unbalanced power of each phase, which can be separated into three types. The first type is the positive-sequence current with negative-sequence voltage as written in the following equation (25). The second type is the negative-sequence current with the positive-sequence voltage as written in the equation (16). The third type is the zero-sequence voltage with converter's output current as written in the equation (15).

$$\begin{bmatrix} P_{pa} \\ P_{pb} \\ P_{pc} \end{bmatrix} = \begin{bmatrix} \frac{1}{2}V_q^n & -\frac{1}{2}V_d^n \\ -\frac{1}{4}V_q^n + \frac{\sqrt{3}}{4}V_d^n & \frac{1}{4}V_d^n + \frac{\sqrt{3}}{4}V_q^n \\ -\frac{1}{4}V_q^n - \frac{\sqrt{3}}{4}V_d^n & \frac{1}{4}V_d^n - \frac{\sqrt{3}}{4}V_q^n \end{bmatrix} \begin{bmatrix} I_q^p \\ I_d^p \end{bmatrix} \quad (25)$$

In FIG. 18, when the voltage is in the normal state, the switch 1821 is switched to "1", at this time the logic circuit 820 generates an active power current command $I_d^{p*}$ according to the overall reactive power $Q_T$, the positive-sequence voltages $V_q^p$ and $V_d^p$, and the positive-sequence current $I_q^p$. The reactive power $Q_T$ is used to compensate the power loss of the converter. To be specific, based on the instantaneous power theory, the reactive current command $I_d^{p*}$ is generated according to the following equation (26).

$$I_d^p = \frac{1}{V_q^p}\left(\frac{2}{3}Q_T + V_d^p I_q^p\right) \quad (26)$$

Figure 19:
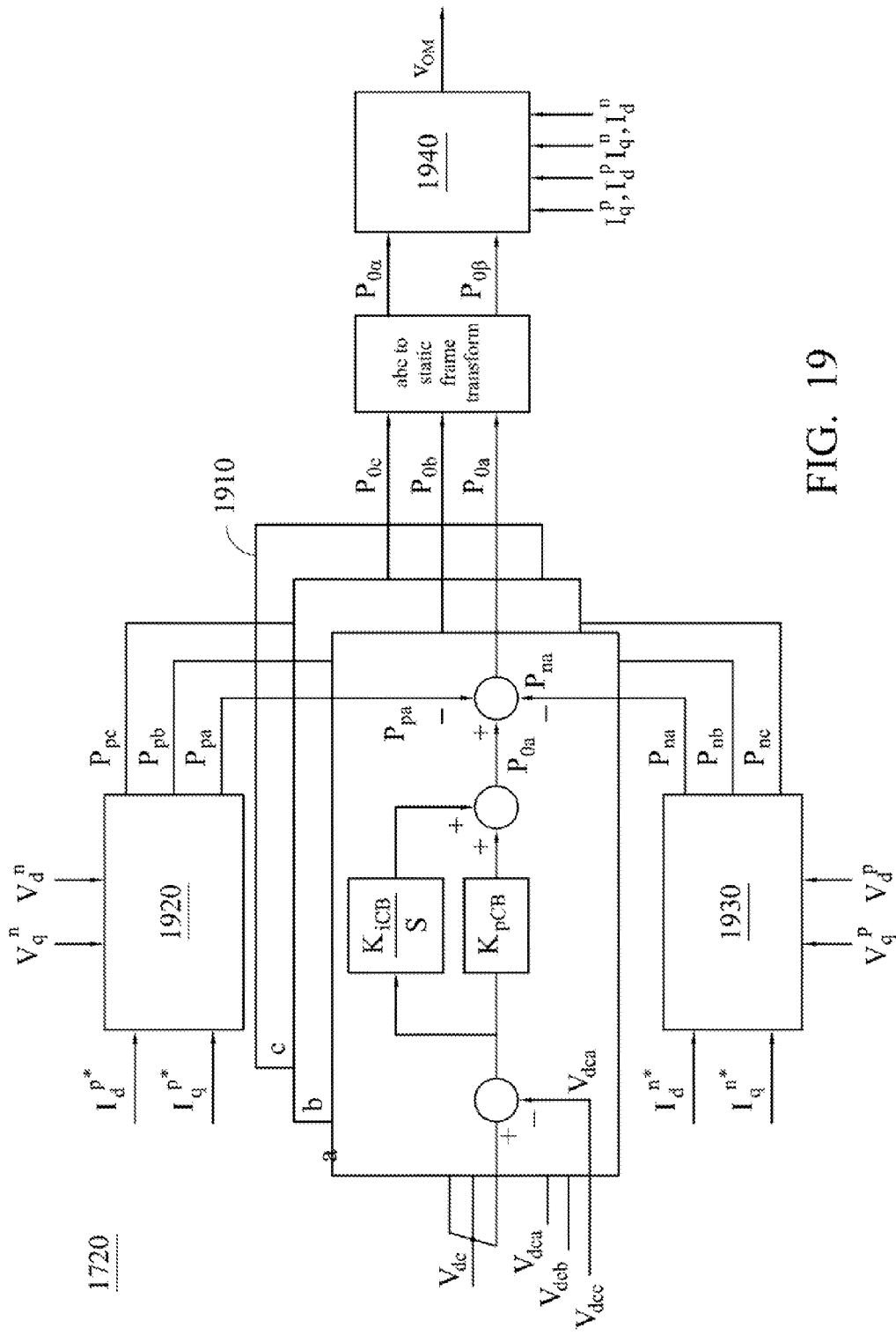
FIG. 19 is a block diagram of the zero-sequence voltage generating circuit according to the third embodiment.

FIG. 19 is a block diagram of the zero-sequence voltage generating circuit according to the third embodiment. Referring to FIG. 19, a logic circuit 1910 calculates the error between the overall averaged value $V_{dc}$ and the averaged values $V_{dcm}$, and calculates required power $P_{ca}$, $P_{cb}$, and $P_{cc}$ of each phase by a PI control. On the other hand, a logic circuit 1920 calculates power $P_{pa}$, $P_{pb}$, and $P_{pc}$ according to the equation (25), and a logic circuit 1930 calculates power $P_{na}$, $P_{nb}$, and $P_{nc}$ according to the equation (15). Next, the logic circuit 1910 calculates power $P_{0a}$, $P_{0b}$, $P_{0c}$, and a logic circuit 1940 calculates the zero-sequence voltage injection signal $v_{OM}$ according to the following equation (27).

$$\begin{bmatrix} \|V_{OM}\|\cos\gamma \\ |V_{OM}|\sin\gamma \end{bmatrix} = \frac{2}{(I^n)^2 - (I^p)^2}\begin{bmatrix} I_q^n - I_q^p & I_d^n - I_d^p \\ I_d^n + I_d^p & -I_q^n - I_q^p \end{bmatrix}\begin{bmatrix} P_{0\alpha} \\ P_{0\beta} \end{bmatrix} \quad (27)$$

As discussed above, in the controller and the power flow managing method provided by the embodiments of the invention, power flows are adjusted according to the zero-sequence voltage signal and, positive-, negative-, and zero-sequence power are all considered. Therefore, it achieves better voltage balance and reactive power compensation. In addition, in some embodiment, it has features of fault tolerance control and peak value limitation.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A power flow managing method for a controller disposed in a power system, wherein the power system comprises a power providing module and a multilevel converter module, the power flow managing method comprising:
   obtaining a plurality of sensed voltage signals and a plurality of sensed current signals between the power providing module and the multilevel converter module;
   generating a plurality of positive-sequence voltage signals, a plurality of positive-sequence current signals, a plurality of negative-sequence voltage signals and a plurality of negative-sequence current signals according to the sensed voltage signals and the sensed current signals;
   calculating feedforward power according to the positive-sequence voltage signals, the positive-sequence current signals, the negative-sequence voltage signals and the negative-sequence current signals;
   obtaining a plurality of DC (direct-current) voltage signals from the multilevel converter module, and calculating a plurality of averaged values and an overall averaged value according to the DC voltage signals;
   calculating feedback power according to the averaged values and the overall averaged value;
   determining real power of a zero-sequence voltage injection signal according to the feedforward power and the feedback power; and
   determining a magnitude and a phase of the zero-sequence voltage injection signal according to the real power of the zero-sequence voltage injection signal, the positive-sequence current signals and the negative-sequence current signals.

2. The power flow managing method of claim 1, wherein the DC voltage signals comprises a plurality of first DC voltage signals at a first phase, a plurality of second DC voltage signals at a second phase, and a plurality of third DC voltage signals at a third phase, and the step of calculating the averaged values and the overall averaged value comprises:
   performing a moving average filter and an average operation on the first DC voltage signals to obtain a first averaged value of the averaged values;
   performing the moving average filter and the average operation on the second DC voltage signals to obtain a second averaged value of the averaged values;
   performing the moving average filter and the average operation on the third DC voltage signals to obtain a third averaged value of the averaged values; and
   calculating an average of the first averaged value, the second averaged value and the third averaged value as the overall averaged value.

3. The power flow managing method of claim 2, wherein the step of generating the feedback power according to the averaged values and the overall averaged value comprises:
   subtracting the first averaged value from the overall averaged value to generate a first difference value, and generating first feedback power of the feedback power according to the first difference value by a first proportional controller;
   subtracting the second averaged value from the overall averaged value to generate a second difference value, and generating second feedback power of the feedback power according to the second difference value by a second proportional controller; and
   subtracting the third averaged value from the overall averaged value to generate a third difference value, and generating third feedback power of the feedback power according to the third difference value by a third proportional controller.

4. The power flow managing method of claim 3, wherein the feedforward power comprises first feedforward power, second feedforward power, and third feedforward power, and the step of determining of the real power of the zero-sequence voltage injection signal according to the feedforward power and the feedback power comprises:
   subtracting the first feedforward power from the first feedback power to generate a first power command;
   subtracting the second feedforward power from the second feedback power to generate a second power command;
   subtracting the third feedforward power from the third feedback power to generate a third power command; and
   performing an alpha-beta transform on the first power command, the second power command and the third power command to obtain the real power of the zero-sequence voltage injection signal.

5. The power flow managing method of claim 4, further comprising:
   generating a plurality of balanced voltage signals according to the DC voltage signals and the averaged values;

generating a plurality of positive-sequence current commands and a plurality of negative-sequence current commands according to a real power command, a reactive power command, and the overall averaged value;

generating a plurality of reference voltage signals according to the positive-sequence current commands, the negative-sequence current commands, the positive-sequence voltage signals, the positive-sequence current signals, the negative-sequence voltage signals and the negative-sequence current signals; and generating a plurality of modulating reference signals according to the reference voltage signals, the zero-sequence voltage injection signal, and the balanced voltage signals, wherein the modulating reference signals are configured to generate a modulated signal.

6. The power flow managing method of claim 5, further comprising:

if a voltage sag occurs, controlling the negative-sequence current commands to decrease a plurality of magnitudes of the negative-sequence voltage signals, and controlling a plurality of magnitudes of the negative-sequence current commands by using a peak upper limit of an overall current.

7. The power flow managing method of claim 6, further comprising:

determining the magnitudes of the negative-sequence current commands according to phases of the negative-sequence voltage signals, phases of the positive-sequence current signals and the peak upper limit.

8. The power flow managing method of claim 2, further comprising:

obtaining bridge cell information of the multilevel converter module, wherein the bridge cell information indicates whether each of a plurality of bridge cell in the multilevel converter module is damaged; and limiting a magnitude and a phase of the zero-sequence voltage injection signal according to the bridge cell information.

9. The power flow managing method of claim 8, wherein the step of limiting the magnitude and the phase of the zero-sequence voltage injection signal according to the bridge cell information comprises:

calculating a plurality of converter outputting voltages;
selecting one of the converter outputting voltages according to the bridge cell information; and
determining an upper limit and a lower limit of the magnitude of the zero-sequence voltage injection signal according to the overall averaged value and the one of the converter outputting voltages.

10. A controller disposed in a power system, wherein the power system comprises a power providing module and a multilevel converter module, and the controller comprising:

a component extracting circuit configured to obtain a plurality of sensed voltage signals and a plurality of sensed current signals between the power providing module and the multilevel converter module, and to generate a plurality of positive-sequence voltage signals, a plurality of positive-sequence current signals, a plurality of negative-sequence voltage signals and a plurality of negative-sequence current signals according to the sensed voltage signals and the sensed current signals;

an average value calculating circuit configured to obtain a plurality of DC (direct-current) voltage signals from the multilevel converter module, and to calculate a plurality of averaged values and an overall averaged value according to the DC voltage signals; and a zero-sequence voltage generating circuit coupled to the component extracting circuit and the average value calculating circuit, and configured to calculate feedforward power according to the positive-sequence voltage signals, the positive-sequence current signals, the negative-sequence voltage signals and the negative-sequence current signals, and to calculate feedback power according to the averaged values and the overall averaged value, and to determine real power of a zero-sequence voltage injection signal according to the feedforward power and the feedback power, and to determine an magnitude and a phase of the zero-sequence voltage injection signal according to the real power of the zero-sequence voltage injection signal, the positive-sequence current signals and the negative-sequence current signals.

11. The controller of claim 10, wherein the DC voltage signals comprises a plurality of first DC voltage signals at a first phase, a plurality of second DC voltage signals at a second phase, and a plurality of third DC voltage signals at a third phase, wherein the average value calculating circuit is further configured to perform a moving average filter and an average operation on the first DC voltage signals to obtain a first averaged value of the averaged values, to perform the moving average filter and the average operation on the second DC voltage signals to obtain a second averaged value of the averaged values, to perform the moving average filter and the average operation on the third DC voltage signals to obtain a third averaged value of the averaged values, and to calculate an average of the first averaged value, the second averaged value and the third averaged value as the overall averaged value.

12. The controller of claim 11, wherein the zero-sequence voltage generating circuit comprises a feedforward power calculating circuit and a feedback power calculating circuit, and the feedforward power calculating circuit is configured to calculate the feedforward power, wherein the feedback power calculating circuit subtracts the first averaged value from the overall averaged value to generate a first difference value, and generates first feedback power of the feedback power according to the first difference value by a first proportional controller, the feedback power calculating circuit subtracts the second averaged value from the overall averaged value to generate a second difference value, and generates second feedback power of the feedback power according to the second difference value by a second proportional controller, the feedback power calculating circuit subtracts the third averaged value from the overall averaged value to generate a third difference value, and generates third feedback power of the feedback power according to the third difference value by a third proportional controller.

13. The controller of claim 12, wherein the zero-sequence voltage generating circuit further comprises a zero-sequence voltage calculating circuit coupled to the feedback power calculating circuit and the feedforward power calculating circuit, and the feedforward power comprises first feedforward power, second feedforward power and third feedforward power, wherein the zero-sequence voltage calculating circuit subtracts the first feedforward power from the first feedback power to generate a first power command, subtracts the second feedforward power from the second feedback power to generate a second power command, subtracts the third feedforward power from the third feedback power to generate a third power command; and performs an alpha-beta transform on the first power command, the second power command and the third power command to obtain the real power of the zero-sequence voltage injection signal.

14. The controller of claim 13, further comprising:
an individual balancing controlling circuit coupled to the average value calculating circuit, and configured to generate a plurality of balanced voltage signals according to the DC voltage signals and the averaged values;
a current command generating circuit coupled to the average value calculating circuit, and configured to generate a plurality of positive-sequence current commands and a plurality of negative-sequence current commands according to a real power command, a reactive power command, and the overall averaged value;
a current regulating circuit coupled to the component extracting circuit and the current command generating circuit, and configured to generate a plurality of reference voltage signals according to the positive-sequence current commands, the negative-sequence current commands, the positive-sequence voltage signals, the positive-sequence current signals, the negative-sequence voltage signals and the negative-sequence current signals; and
a calculating circuit coupled to the current regulating circuit, the zero-sequence voltage generating circuit and the individual balancing controlling circuit, and configured to generate a plurality of modulating reference signals according to the reference voltage signals, the zero-sequence voltage injection signal, and the balanced voltage signals, wherein the modulating reference signals are configured to generate a modulated signal.

15. The controller of claim 14, wherein if a voltage sag occurs, the current command generating circuit controls the negative-sequence current commands to decrease a plurality of magnitudes of the negative-sequence voltage signals, and controls a plurality of magnitudes of the negative-sequence current commands by using a peak upper limit of an overall current.

16. The controller of claim 15, wherein the current command generating circuit is further configured to determine the magnitudes of the negative-sequence current commands according to phases of the negative-sequence voltage signals, phases of the positive-sequence current signals and the peak upper limit.

17. The controller of claim 11, wherein the zero-sequence voltage generating circuit is further configured to obtain bridge cell information of the multilevel converter module, wherein the bridge cell information indicate whether each of a plurality of bridge cell in the multilevel converter module is damaged,
wherein the zero-sequence voltage generating circuit limits a magnitude and a phase of the zero-sequence voltage injection signal according to the bridge cell information.

18. The controller of claim 17, wherein the zero-sequence voltage generating circuit is further configured to calculate a plurality of converter outputting voltages, select one of the converter outputting voltages according to the bridge cell information, and determine an upper limit and a lower limit of the magnitude of the zero-sequence voltage injection signal according to the overall averaged value and the one of the converter outputting voltages.

* * * * *